(12) United States Patent
Nakada et al.

(10) Patent No.: US 9,437,543 B2
(45) Date of Patent: Sep. 6, 2016

(54) COMPOSITE CONTACT VIA STRUCTURE CONTAINING AN UPPER PORTION WHICH FILLS A CAVITY WITHIN A LOWER PORTION

(71) Applicant: SanDisk Technologies, Inc., Plano, TX (US)

(72) Inventors: Akira Nakada, Yokkaichi (JP); Michiaki Sano, Aichi (JP); Motoki Kawasaki, Yokkaichi (JP); Sung Tae Lee, Aichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/602,491

(22) Filed: Jan. 22, 2015

(65) Prior Publication Data

US 2016/0218059 A1    Jul. 28, 2016

(51) Int. Cl.
| | |
|---|---|
| *H01L 29/792* | (2006.01) |
| *H01L 23/528* | (2006.01) |
| *H01L 27/115* | (2006.01) |
| *H01L 23/522* | (2006.01) |
| *H01L 23/532* | (2006.01) |

(52) U.S. Cl.
CPC ......... *H01L 23/528* (2013.01); *H01L 23/5226* (2013.01); *H01L 23/53223* (2013.01); *H01L 23/53238* (2013.01); *H01L 23/53266* (2013.01); *H01L 27/11556* (2013.01); *H01L 27/11582* (2013.01)

(58) Field of Classification Search
CPC ............ H01L 23/528; H01L 23/5226; H01L 23/53223; H01L 23/53238; H01L 23/53266; H01L 27/11556; H01L 27/11582; H01L 27/115; H01L 23/532; H01L 29/792

USPC .............. 257/324, E21.585; 438/30, 667
See application file for complete search history.

(56) References Cited

U.S. PATENT DOCUMENTS 5,915,167 A     6/1999 Leedy
8,921,918 B2 * 12/2014 Shim ................. H01L 27/11578
                                                              257/324

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Caleb Henry
(74) *Attorney, Agent, or Firm* — The Marbury Law Group PLLC

(57) ABSTRACT

A contact via cavity can be filled with a lower structure and an upper structure. The lower structure can be a conductive structure that is formed by depositing a conformal conductive material, and subsequently removing an upper portion of the conformal conductive material. A disposable material portion can be formed at a bottom of the cavity to protect the bottom portion of the conformal conductive layer during removal of the upper portion. After removal of the disposable material, at least one conductive material can fill the remainder of the cavity to form the upper structure. The upper structure and the lower structure collectively constitute a contact via structure. Alternatively, the lower structure can be a dielectric spacer with an opening therethrough. The upper structure can be a conductive structure that extends through the dielectric spacer, and provides an electrically conductive vertical connection.

15 Claims, 30 Drawing Sheets

(56) References Cited

U.S. PATENT DOCUMENTS

| | | | | |
|---|---|---|---|---|
| 9,111,799 B2* | 8/2015 | Hwang | ............ | H01L 27/11578 |
| 9,177,966 B1* | 11/2015 | Rabkin | ............ | H01L 27/11582 |
| 9,209,291 B2* | 12/2015 | Bin | ............ | H01L 29/78 |
| 9,214,409 B2* | 12/2015 | Yoo | ............ | H01L 23/48 |
| 2011/0151667 A1 | 6/2011 | Hwang et al. | | |
| 2013/0126957 A1 | 5/2013 | Higashitani et al. | | |
| 2014/0220750 A1* | 8/2014 | Sohn | ............ | H01L 27/11556 |
| | | | | 438/269 |
| 2015/0064885 A1* | 3/2015 | Lee | ............ | H01L 27/11556 |
| | | | | 438/488 |
| 2015/0104916 A1* | 4/2015 | Lee | ............ | H01L 27/1157 |
| | | | | 438/268 |
| 2015/0129954 A1* | 5/2015 | Kim | ............ | H01L 29/7926 |
| | | | | 257/328 |
| 2015/0155297 A1* | 6/2015 | Eom | ............ | H01L 27/11582 |
| | | | | 438/268 |
| 2015/0179660 A1* | 6/2015 | Yada | ............ | H01L 21/02164 |
| | | | | 257/321 |
| 2015/0179662 A1* | 6/2015 | Makala | ............ | H01L 27/11582 |
| | | | | 257/314 |
| 2015/0194440 A1* | 7/2015 | Noh | ............ | H01L 29/66833 |
| | | | | 257/324 |
| 2015/0249093 A1* | 9/2015 | Lee | ............ | H01L 27/11582 |
| | | | | 257/324 |
| 2015/0279852 A1* | 10/2015 | Mizutani | ............ | H01L 27/11556 |
| | | | | 257/315 |
| 2015/0287706 A1* | 10/2015 | Sukekawa | ............ | H01L 25/18 |
| | | | | 257/390 |
| 2015/0287710 A1* | 10/2015 | Yun | ............ | H01L 23/49517 |
| | | | | 257/314 |
| 2015/0348984 A1* | 12/2015 | Yada | ............ | H01L 27/11582 |
| | | | | 257/316 |

OTHER PUBLICATIONS

Office Communication Concerning Corresponding U.S. Appl. No. 14/501,539, filed Sep. 30, 2014, (19 pages).

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/468,743, filed Aug. 26, 2014, SanDisk Technologies Inc.

U.S. Appl. No. 14/501,539, filed Sep. 30, 2014, SanDisk Technologies Inc.

U.S. Appl. No. 14/491,315, filed Sep. 19, 2014, SanDisk Technologies Inc.

U.S. Appl. No. 14/491,026, filed Sep. 19, 2014, SanDisk Technologies Inc.

U.S. Appl. No. 14/462,209, filed Aug. 14, 2014, SanDisk Technologies Inc.

U.S. Appl. No. 14/540,479, filed Nov. 13, 2014, SanDisk Technologies Inc.

* cited by examiner

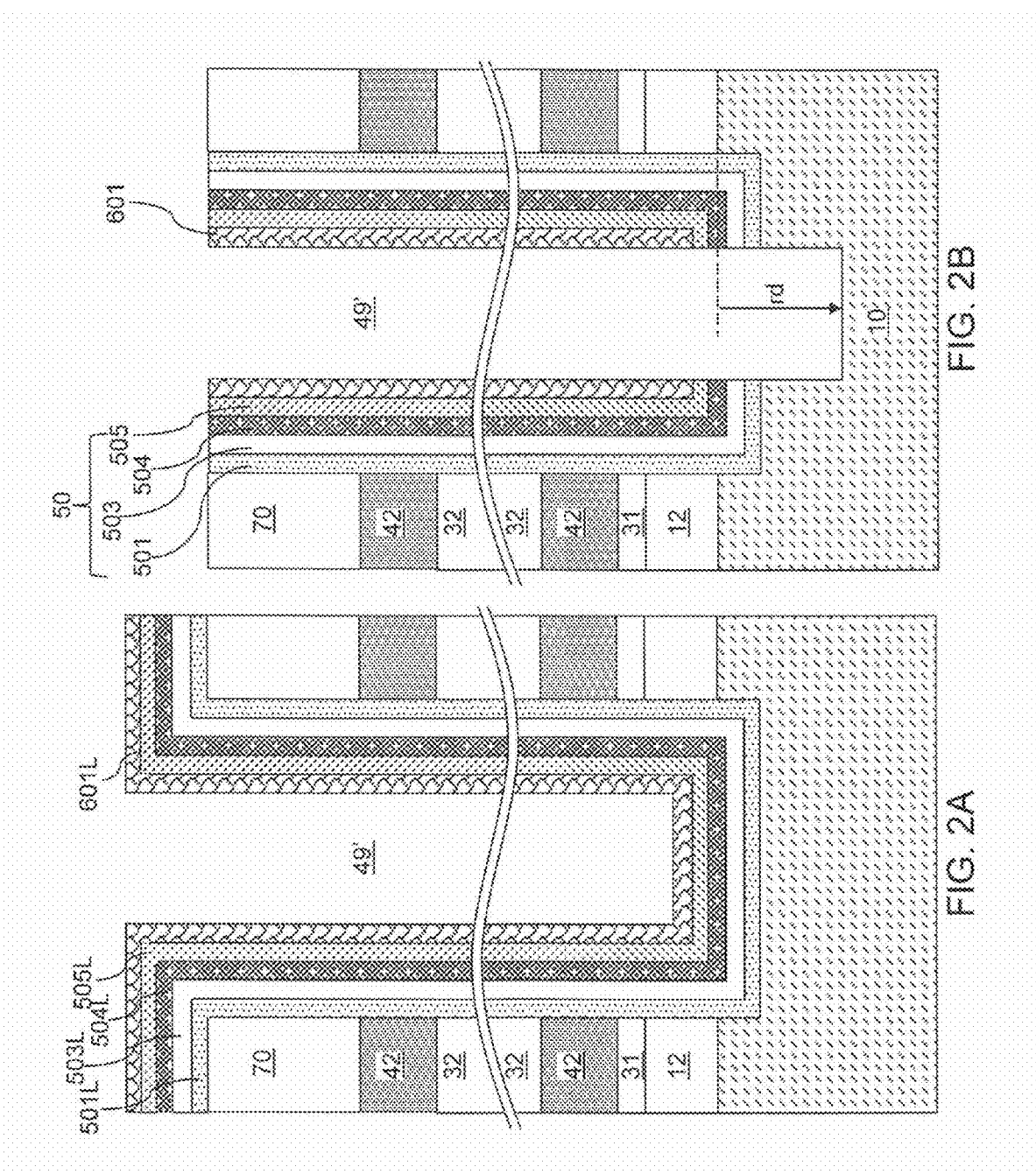

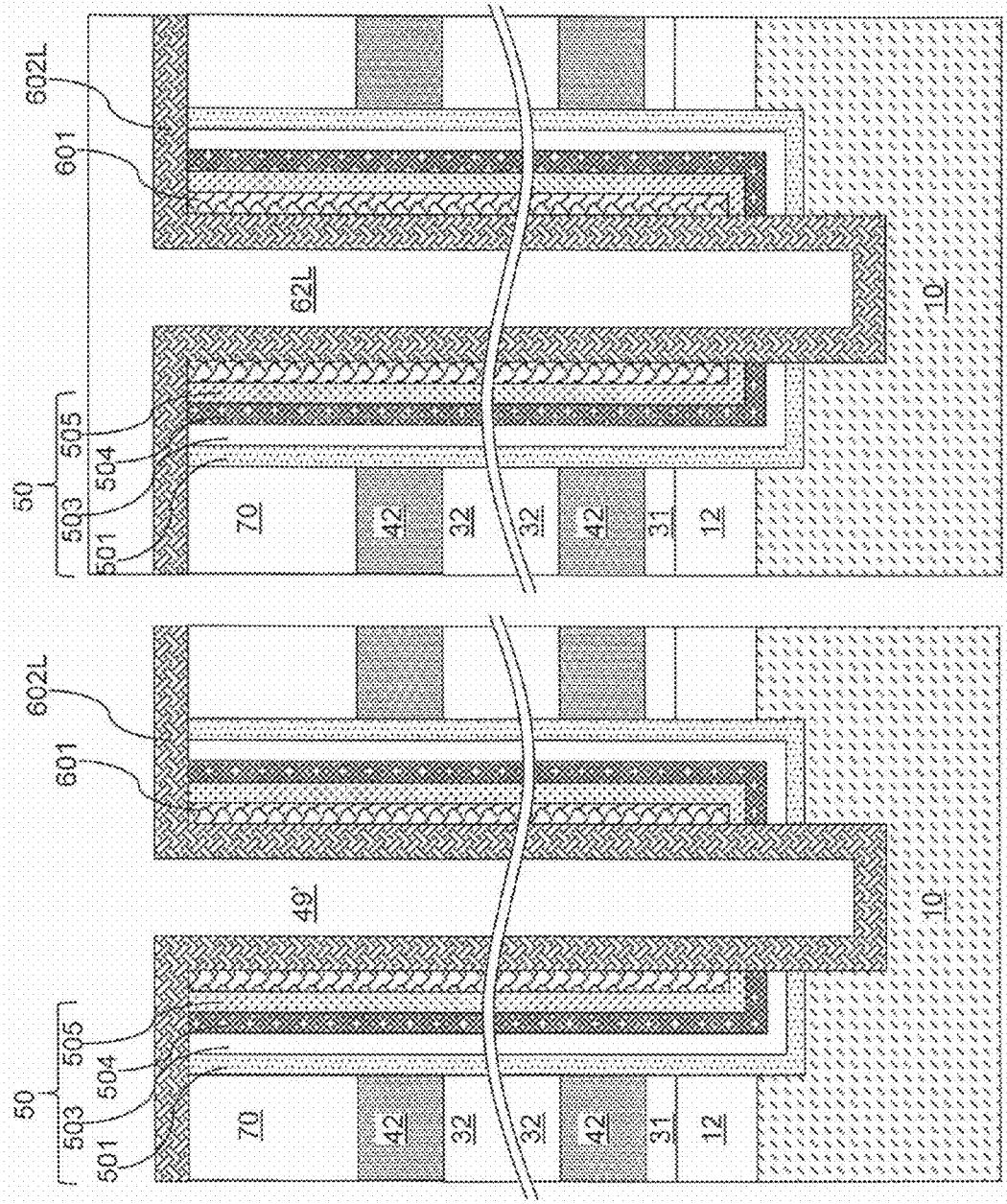

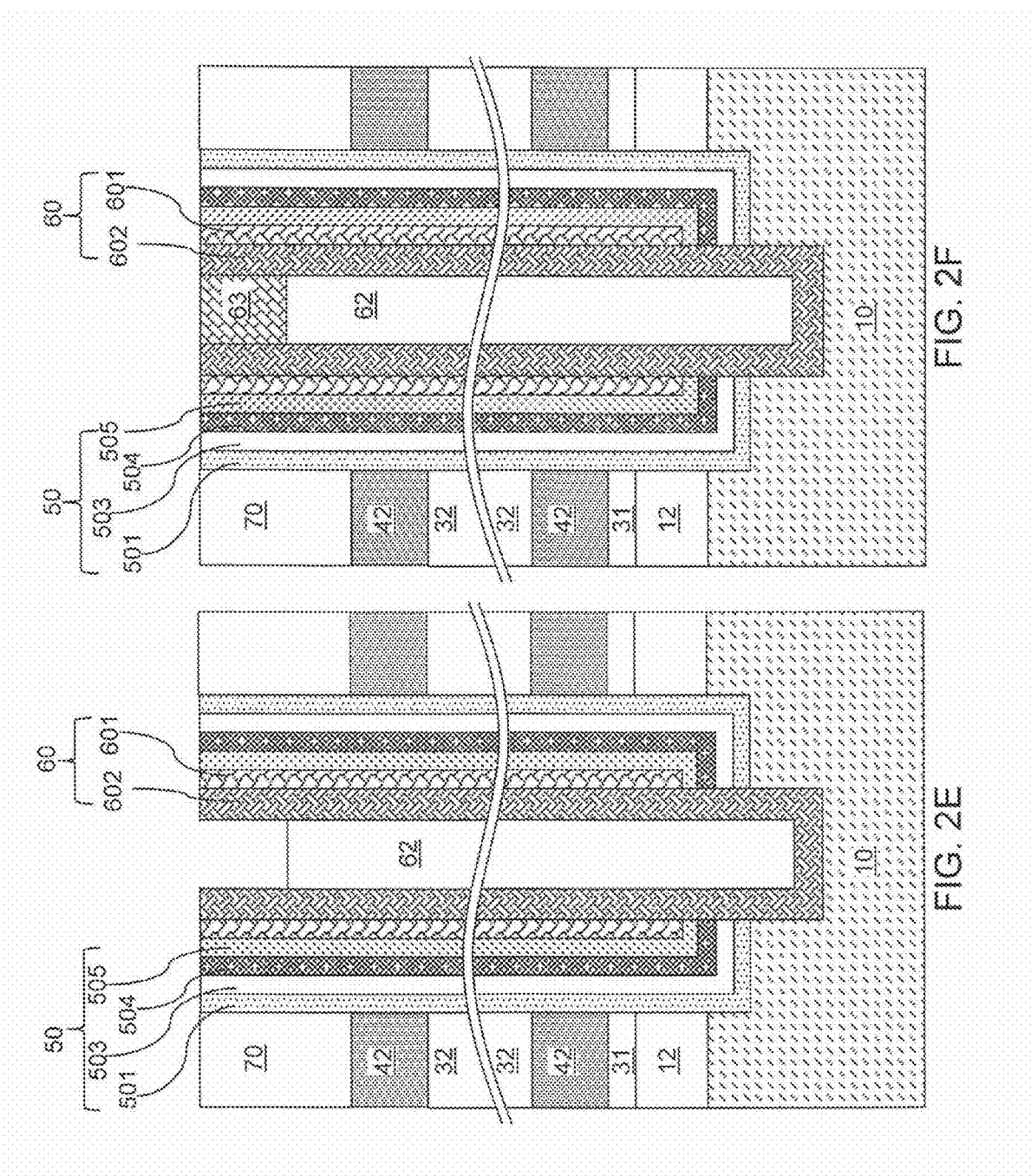

COMPOSITE CONTACT VIA STRUCTURE CONTAINING AN UPPER PORTION WHICH FILLS A CAVITY WITHIN A LOWER PORTION

FIELD

The present disclosure relates generally to the field of semiconductor devices and specifically to metal interconnect structures for providing electrical connection to three-dimensional semiconductor devices, such as vertical NAND strings, and methods of making thereof.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. For example, a 3D NAND stacked memory device may include many levels of control gate electrically conductive layers. Contact via structures extending through many wiring levels can generate significant stress due to the volume of a stress-generating material in the contact via structures.

SUMMARY

According to an aspect of the present disclosure, a structure is provided, which includes a monolithic three-dimensional memory device. The monolithic three-dimensional memory device comprises a stack of alternating layers comprising insulating layers and electrically conductive layers and located over a substrate, a memory opening extending through the stack, a memory film and a semiconductor channel located within the memory opening, a trench vertically extending through the stack and, and a contact via structure located in the trench. The contact via structure is electrically connected to an end of the semiconductor channel, and comprises a lower conductive material portion and an upper conductive material portion. The lower conductive material portion comprises a first conductive material, wherein the lower conductive material portion has a first height that is less than a height of the stack, and contains a cavity therein. The upper conductive material portion comprises at least one second conductive material, wherein the upper conductive material portion fills the cavity within the lower conductive material portion, contacts the topmost portion of the lower conductive material portion, and extends to a top portion of the trench.

According to another aspect of the present disclosure, a structure is provided, which comprises at least one material layer located over a substrate, a trench vertically extending from a topmost surface of the at least one material layer to a surface of the substrate, and a contact via structure located in the trench and comprising a lower conductive material portion and an upper conductive material portion. The lower conductive material portion comprises a first conductive material, contacts the surface of the substrate, has a first height that is less than a total thickness of the at least one material layer, and contains a cavity therein that extends downward from a topmost portion of the lower conductive material portion and has a depth less than the first height. The upper conductive material portion comprises at least one second conductive material, fills the cavity within the lower conductive material portion, contacts the topmost portion of the lower conductive material portion, and extends to an upper portion of the trench.

According to even another aspect of the present disclosure, a method of manufacturing a device structure is provided. At least one material layer is formed over a substrate. A trench is formed through the at least one material layer and to a surface of the substrate. A first conductive material layer comprising a first conductive material is formed in the trench and over the at least one material layer. A first cavity laterally surrounded by the first conductive material layer is present within the trench. A lower portion of the first cavity is filled with a disposable material portion. Portions of the first conductive material layer that are not masked by the disposable material portion are removed. A remaining portion of the first conductive material layer constitutes a lower conductive material portion. The disposable material portion is removed selective to the lower conductive material portion to leave a second cavity. The second cavity and an upper portion of the trench located above the lower conductive material portion are filled with at least one second conductive material.

According to still another aspect of the present disclosure, a structure is provided, which comprises a stack of alternating layers comprising insulating layers and electrically conductive layers and located over a substrate, a trench vertically extending through the stack, a dielectric spacer including an opening therethrough and located at a bottom portion of the trench, and a contact via structure located in the trench. The contact via structure is electrically connected to an end of the semiconductor channel, and a first portion of the contact via structure fills the opening through the dielectric spacer and a second portion of the contact via structure overlies the dielectric spacer.

According to even another aspect of the present disclosure, a method of manufacturing a device structure is provided. At least one material layer is formed over a substrate. A trench is formed through the at least one material layer and to a surface of the substrate. An outer metallic liner is formed within the trench. A dielectric spacer having an opening therethrough is formed within the outer metallic liner. A topmost surface of the dielectric spacer is recessed below a topmost surface of the at least material layer. An inner metallic liner layer is formed on an inner sidewall of the dielectric spacer and an inner sidewall of the outer metallic liner. A conductive fill material is deposited within an unfilled volume of the trench.

BRIEF DESCRIPTION OF THE DRAWINGS

FIGS. 2A-2F are sequential vertical cross-sectional views of a memory opening within the first exemplary structure during various processing steps employed to form a memory stack structure according to the first embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
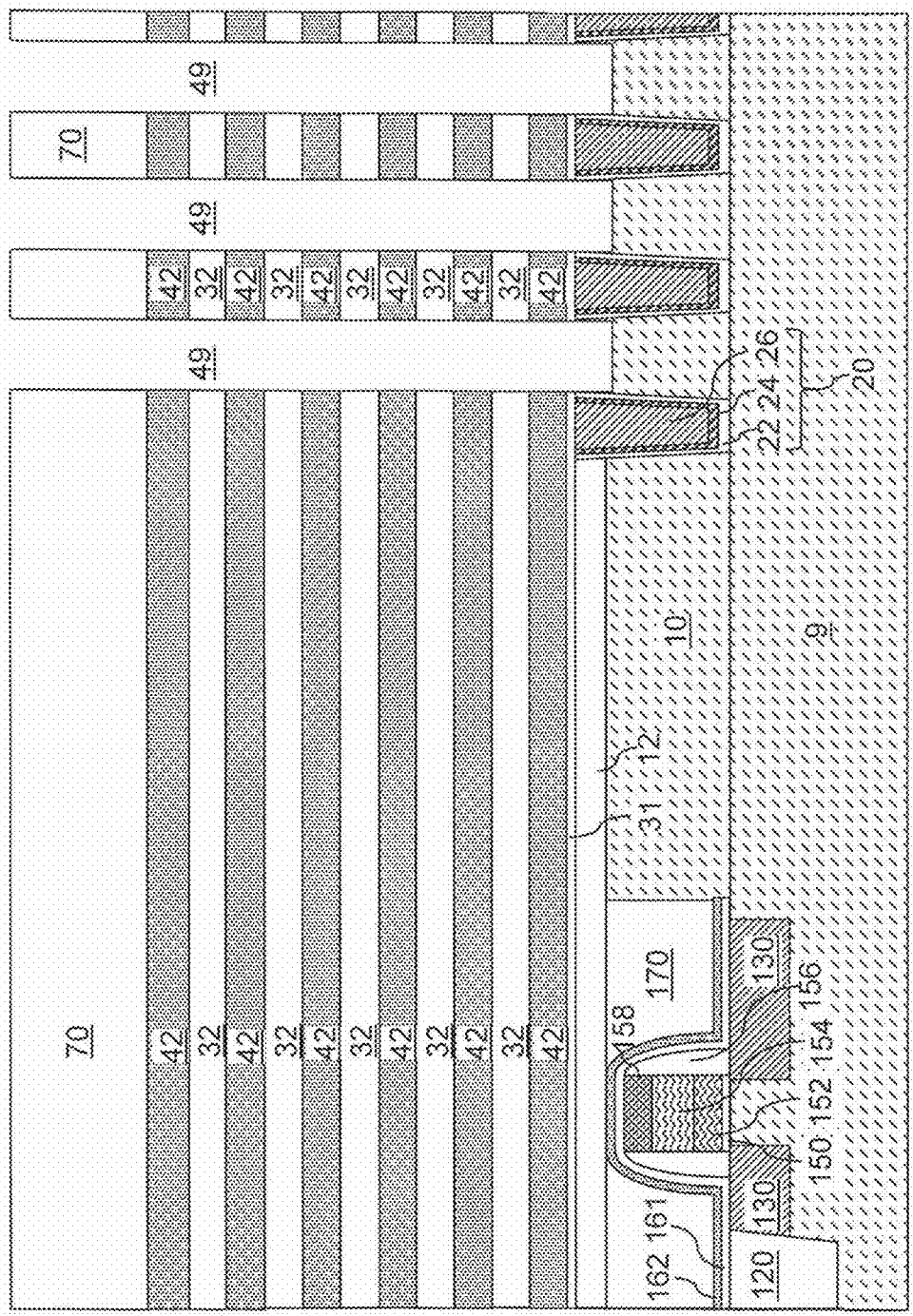
FIG. 1 is a vertical cross-sectional view of a first exemplary structure after formation of a stack including an alternating plurality of material layers and memory openings extending through the stack according to the first embodiment of the present disclosure.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

At least one material layer is formed over a substrate (9, 10) including the semiconductor substrate layer 9 and the semiconductor material layer 10. For example, a stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one insulating material. As such, each insulator layer 32 can be an insulating material layer. Insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. Each of the sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the first exemplary structure during formation of an exemplary memory stack structure according to a first embodiment of the present disclosure. Formation of the exemplary memory stack structure can be performed within each of the memory openings 49 in the first exemplary structure illustrated in FIG. 1.

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

A series of layers including at least one blocking dielectric layer (501L, 503L), a memory material layer 504L, a tunneling dielectric layer 505L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5051, 601L).

Referring to FIG. 2B, the optional first semiconductor channel layer 601L, the tunneling dielectric layer 505L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 505L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 505L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the semiconductor material layer 10 can be physically exposed underneath the opening through the first semiconductor channel portion 601, the tunneling dielectric 505, the charge storage element 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance rd. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2C, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 505 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
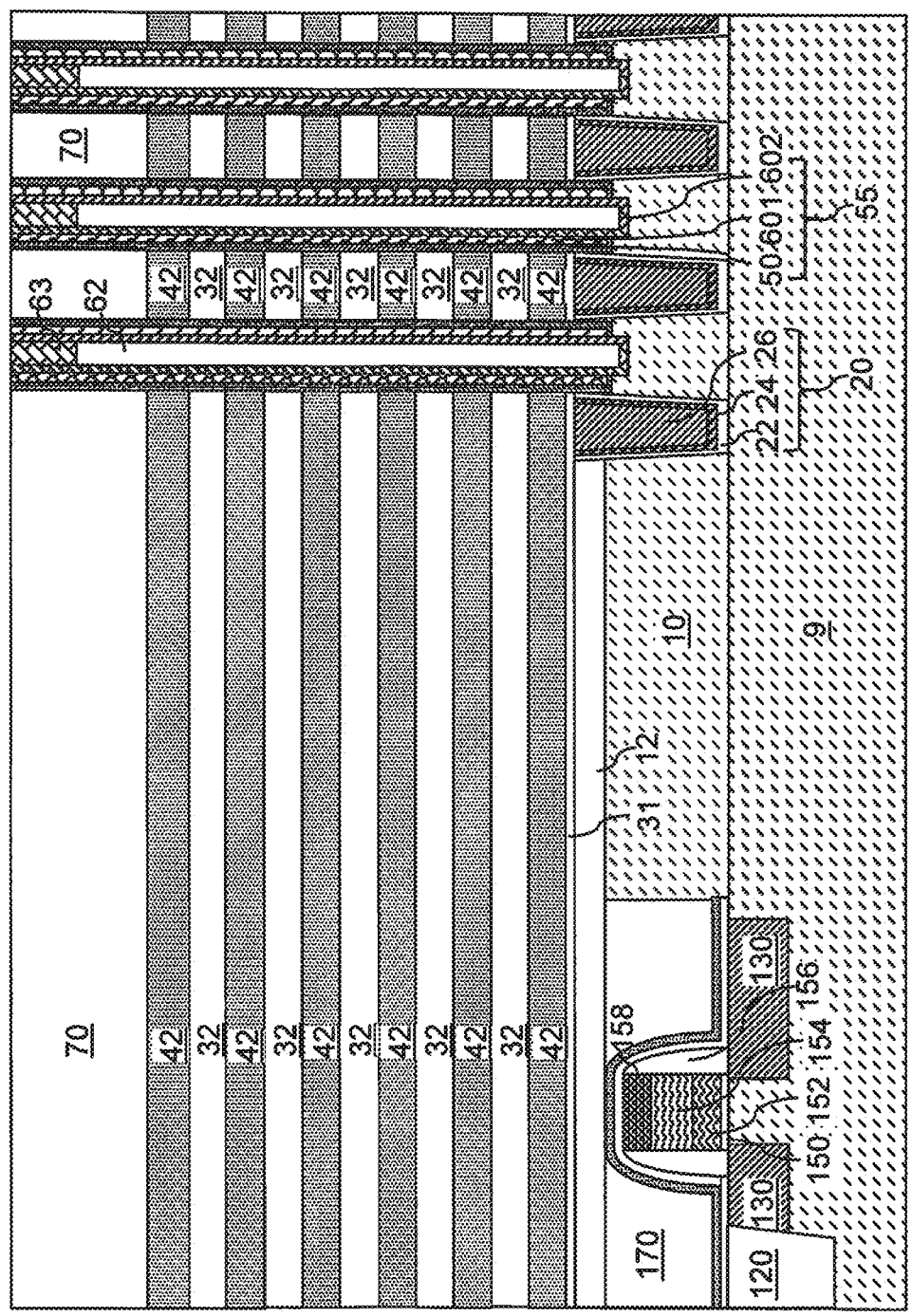
FIG. 3 is a vertical cross-sectional view of the first exemplary structure after formation of memory stack structures according to the first embodiment of the present disclosure.

The exemplary memory stack structure can be embedded into the first exemplary structure illustrated in FIG. 1. FIG. 3 illustrates the first exemplary structure that incorporates multiple instances of the exemplary memory stack structure of FIG. 2F. The first exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
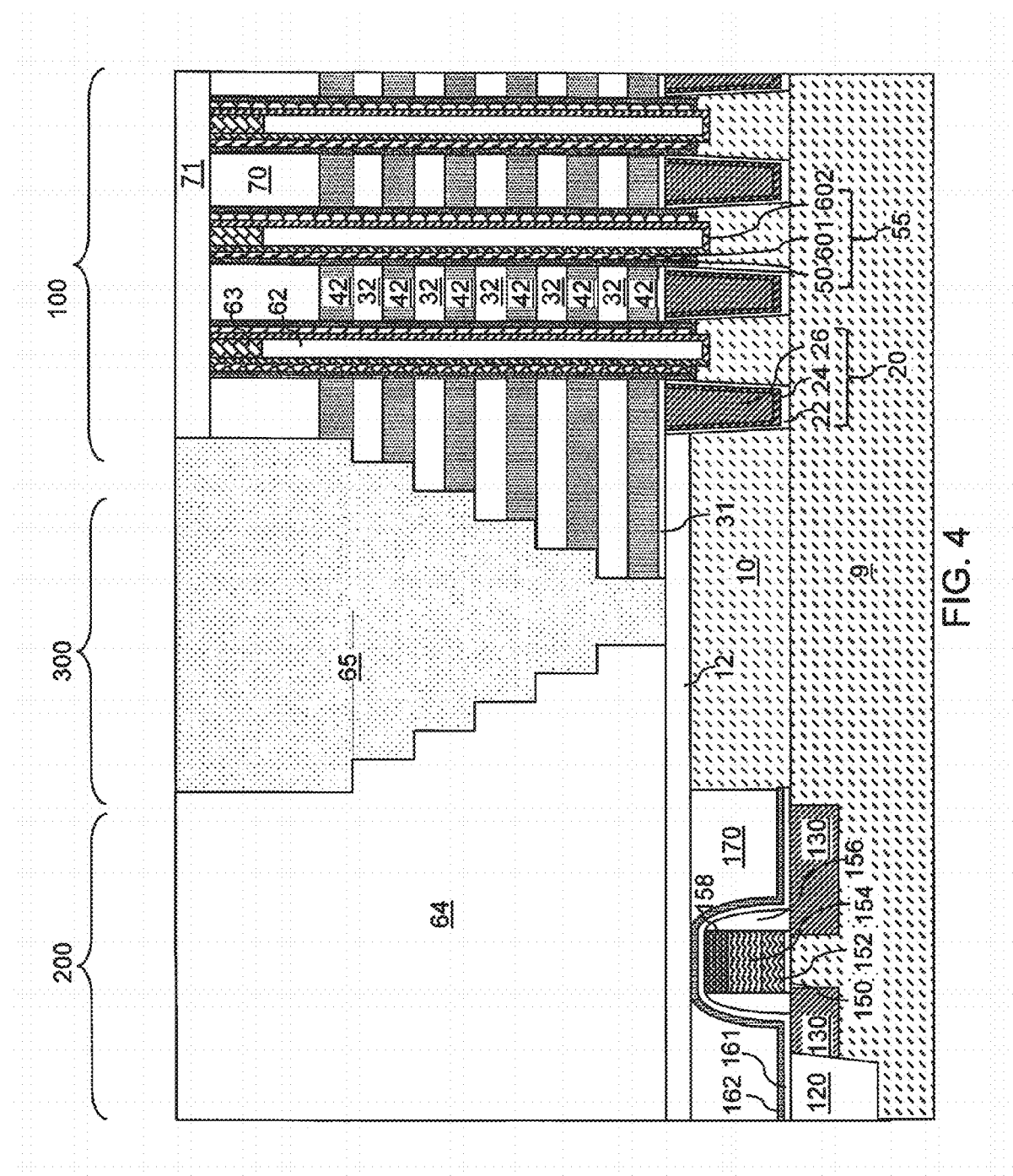
FIG. 4 is a vertical cross-sectional view of the first exemplary structure after formation of a stepped terrace and a retro-stepped dielectric material portion according to the first embodiment of the present disclosure.

Referring to FIG. 4, at least one dielectric cap layer 71 can be formed over the alternating stack (32, 42) and the insulating cap layer 70. The at least one dielectric cap layer 71 is an optional structure. If present, the at least one dielectric cap layer 71 comprises a dielectric material such as silicon oxide, a dielectric metal oxide, a nitrogen-doped organosilicate glass, or a combination thereof. The at least one dielectric cap layer 71 can be employed as an etch stop layer during subsequent planarization processes.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
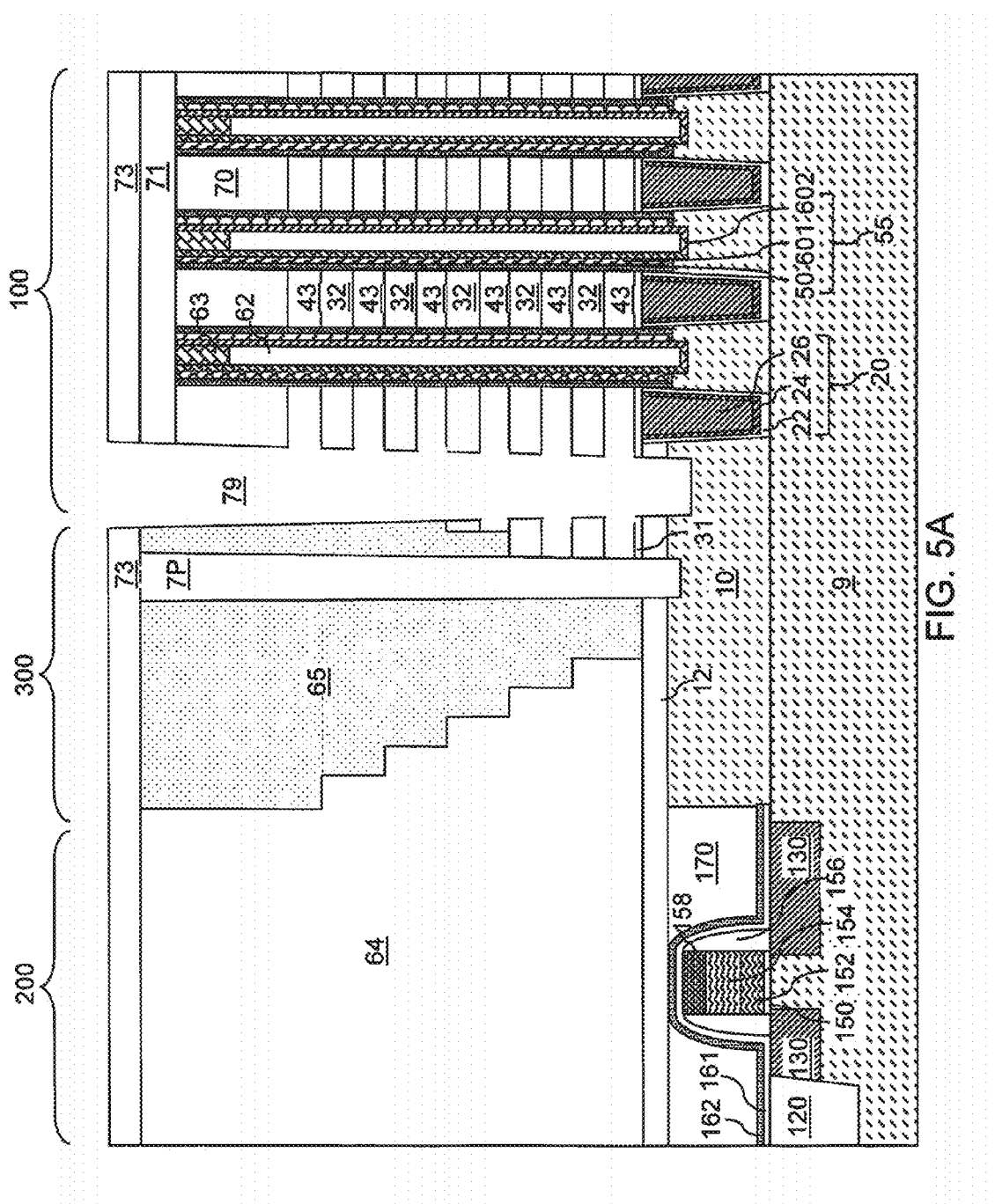
FIG. 5A is a vertical cross-sectional view of the first exemplary structure after formation of a backside via cavity and backside recesses according to the first embodiment of the present disclosure.
Figure 5B:
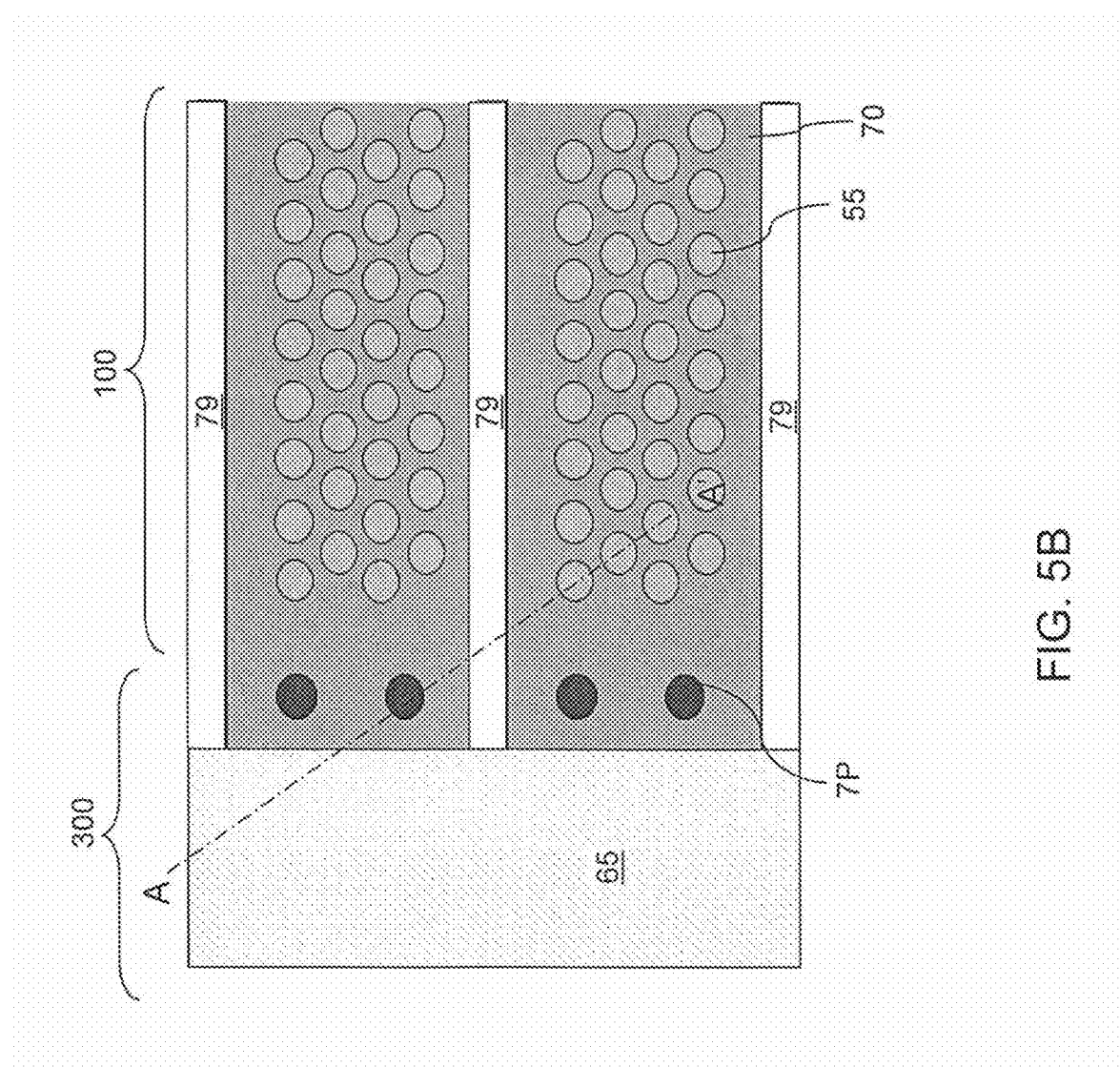
FIG. 5B is a see-through top-down view of the first exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to a plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

Figure 6:
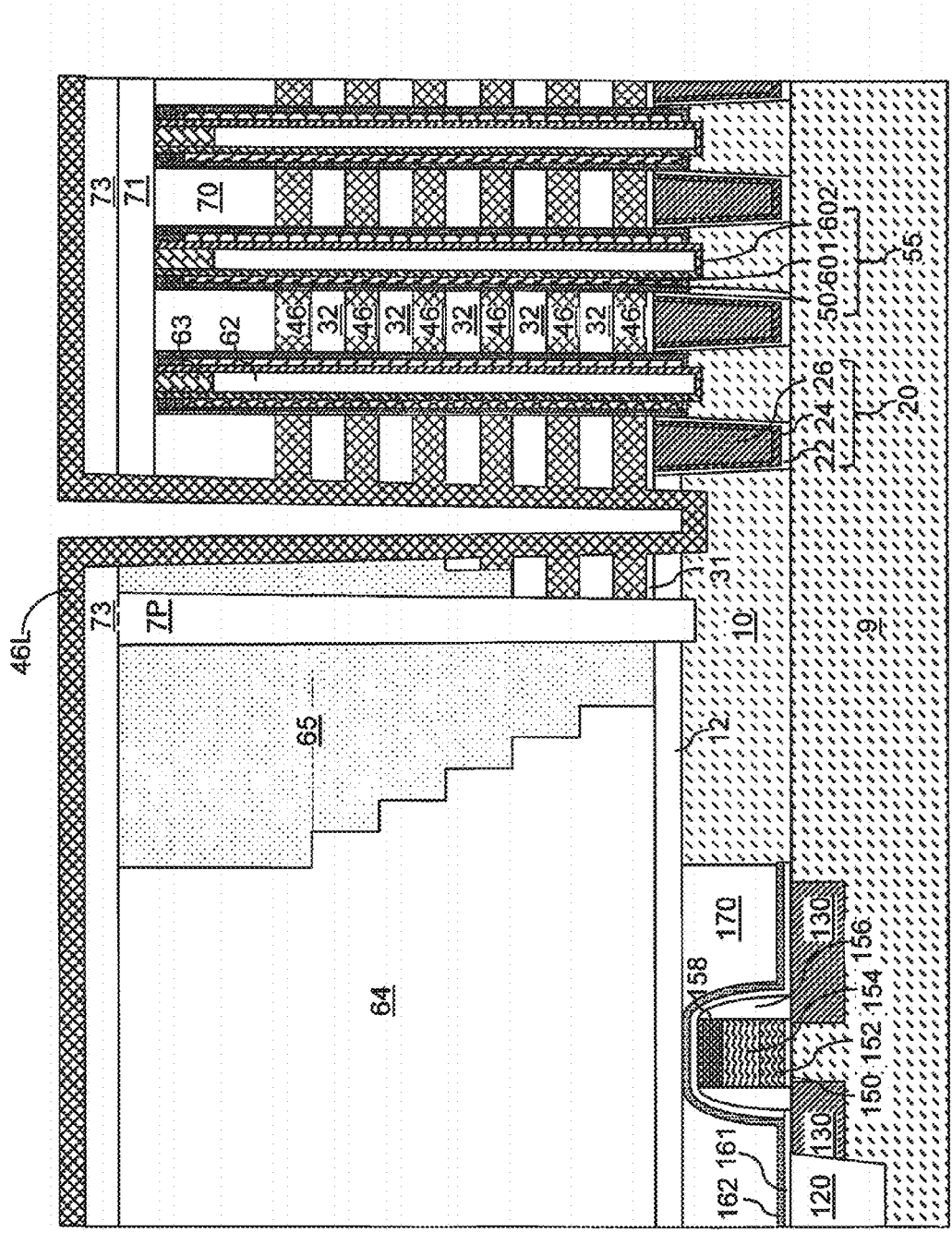
FIG. 6 is a vertical cross-sectional view of the first exemplary structure after formation of electrically conductive lines according to the first embodiment of the present disclosure.

Referring to FIG. 6, a conductive material can be deposited in the plurality of backside recesses 43, on sidewalls of the at least one the backside contact trench 79, and over the top surface of the dielectric pillar material layer 73 (or the topmost layer of the first exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 can be formed in the plurality of backside recesses 43, and a contiguous conductive material layer 46L can be formed on the sidewalls of each backside contact trench 79 and over the dielectric pillar material layer 73 (or the topmost layer of the first exemplary structure in case the dielectric pillar material layer 73 is not employed). Thus, at least a portion of each sacrificial material layer 42 can be replaced with an electrically conductive layer 46, which is a conductive material portion.

Figure 7:
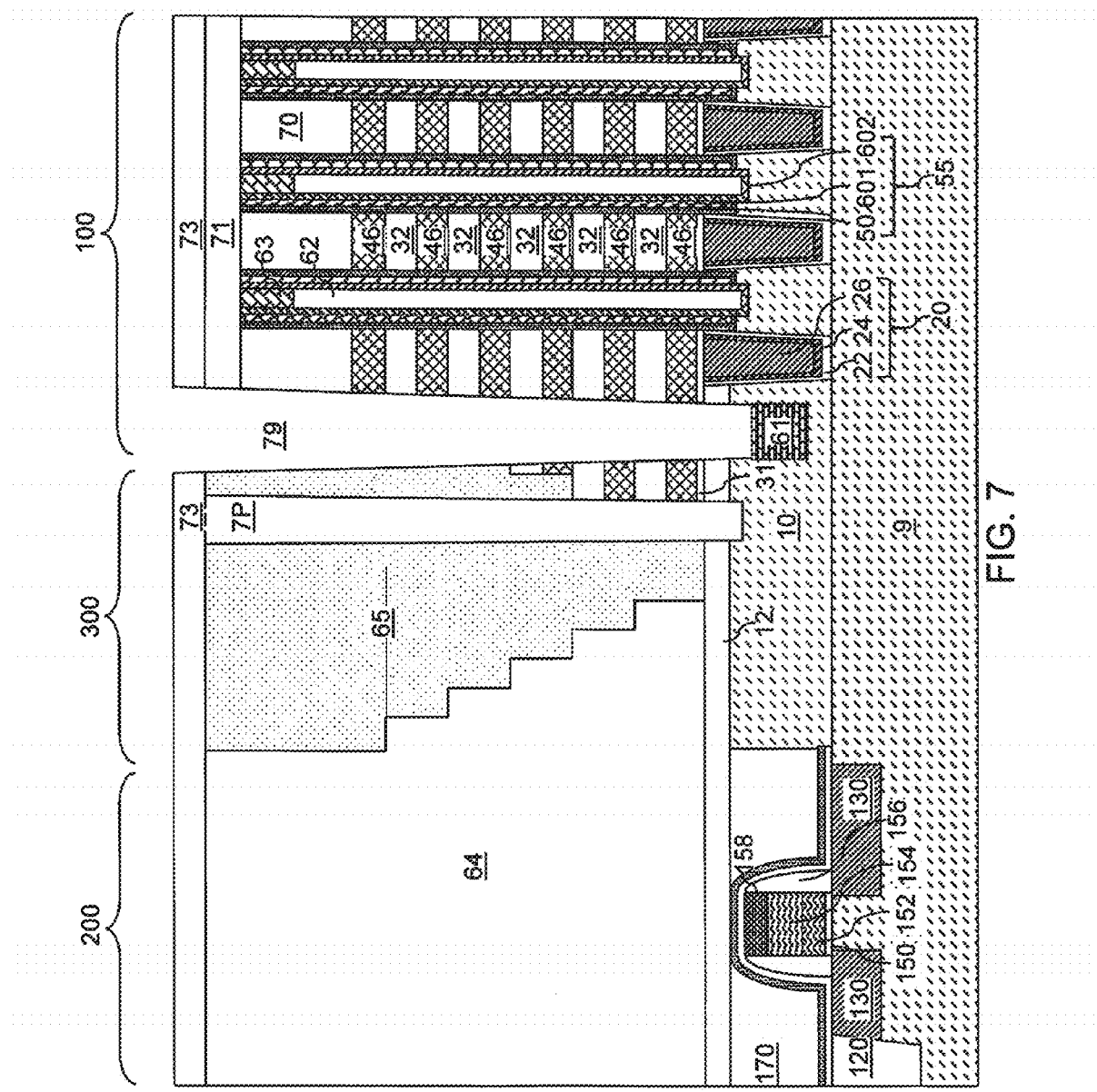
FIG. 7 is a vertical cross-sectional view of the first exemplary structure after removal of a conductive material from a backside contact trench according to the first embodiment of the present disclosure.

Referring to FIG. 7, the deposited conductive material of the contiguous conductive material layer 46L is etched back from the sidewalls of each backside contact trench 79 and from above the dielectric pillar material layer 73 (or the topmost layer of the first exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

A doped semiconductor material portion 61 can be formed directly underneath the surface of the substrate (9, 10), for example, by implantation of electrical dopants (i.e., p-type dopants or n-type dopants). The electrical dopants can be implanted into the substrate (9, 10), for example, by ion implantation or plasma doping. In one embodiment, the doped semiconductor material portion 61 can have the opposite type of the semiconductor channels. For example, if the semiconductor material layer 10 and the semiconductor channels (601, 602) have p-type doping, the doped semiconductor material portion 61 can have n-type doping. In one embodiment, the doped semiconductor material portion 61 can be a source region of vertical NAND stacks embedded within the alternating stack (32, 46).

Figure 8:
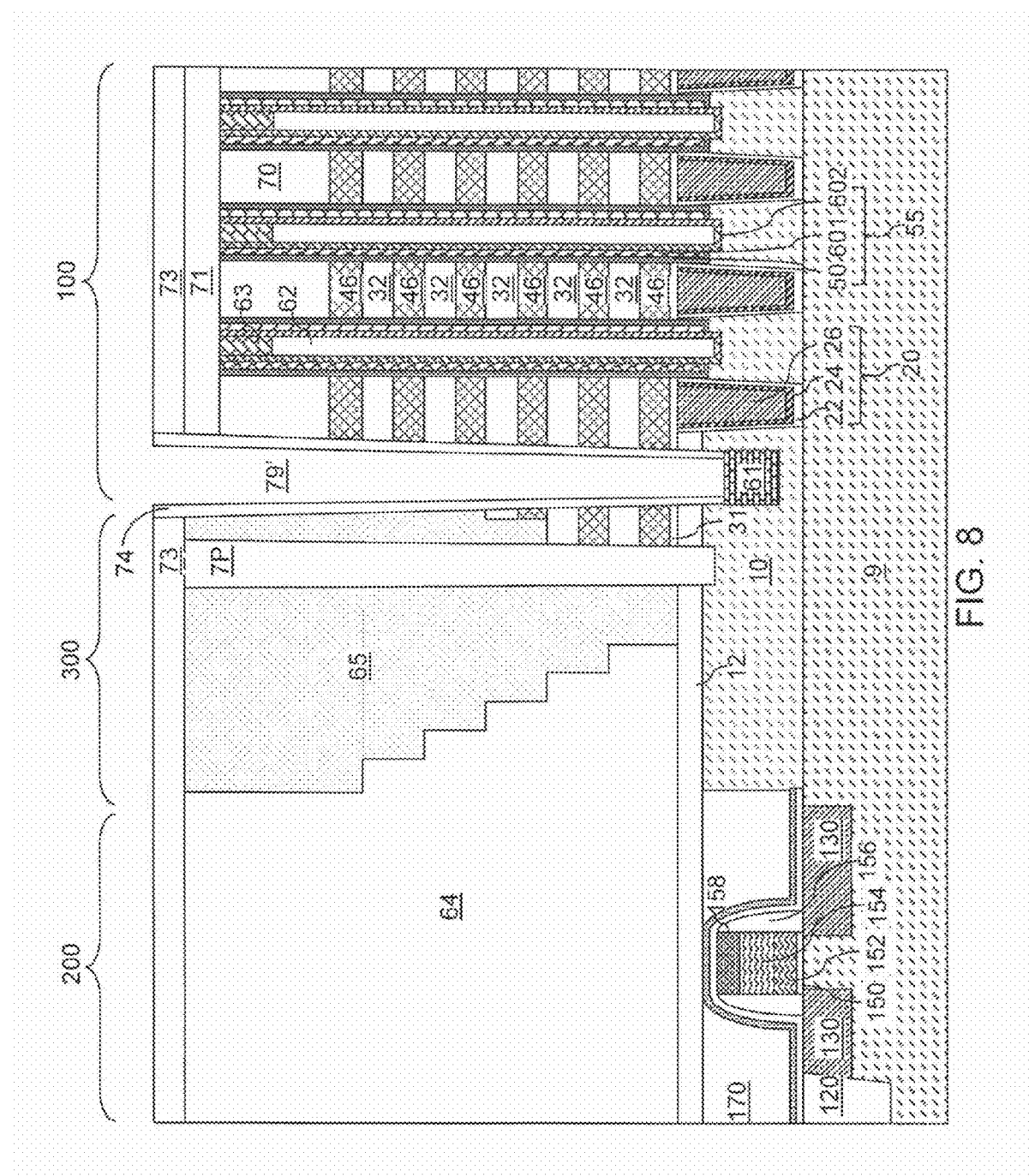
FIG. 8 is a vertical cross-sectional view of the first exemplary structure after formation of an insulating spacer according to the first embodiment of the present disclosure.

Referring to FIG. 8, an insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm. A portion of the surface of the substrate (9, 10), such as the doped semiconductor material portion 61, is physically exposed after formation of the insulating spacer 74.

Figure 9:
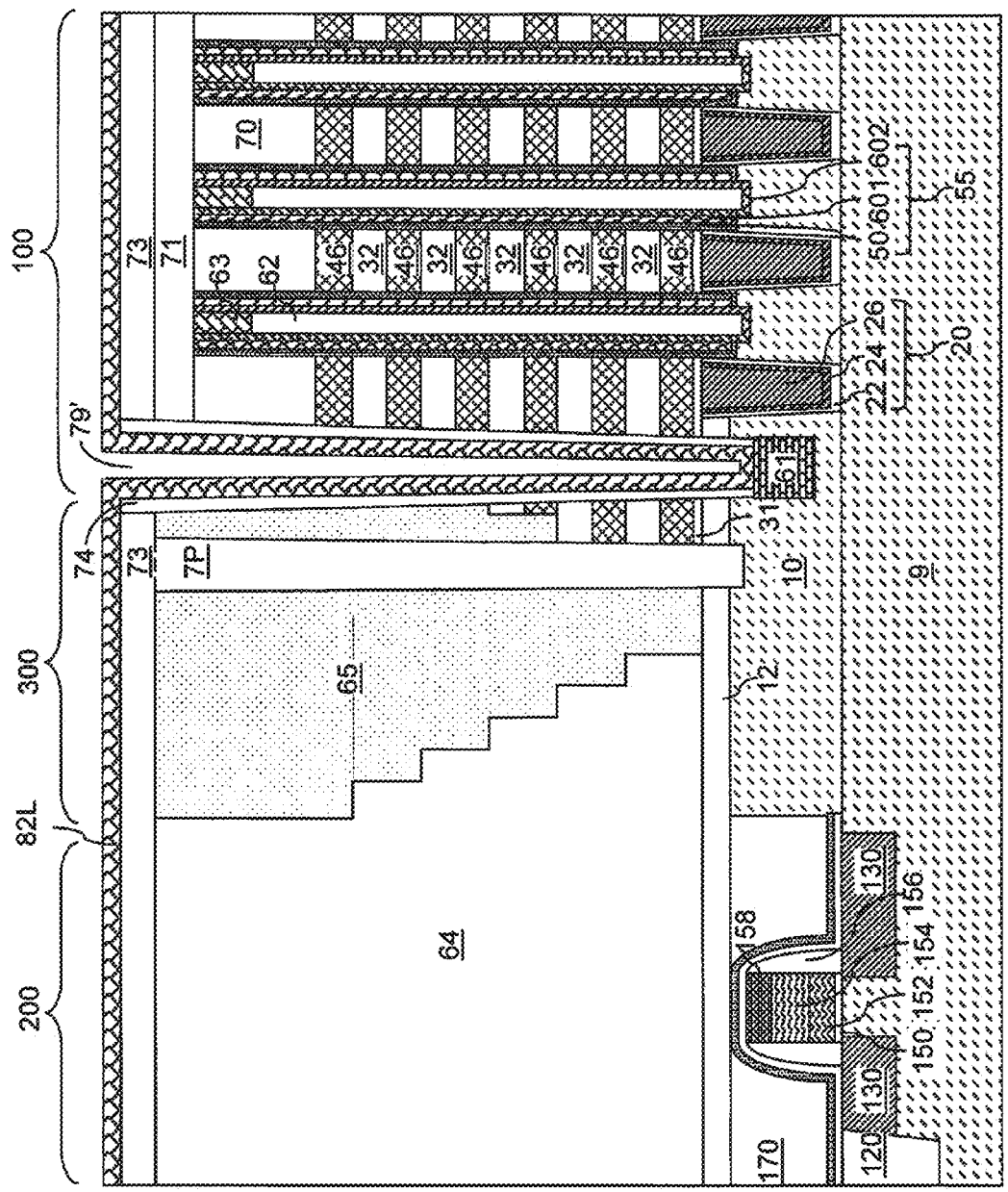
FIG. 9 is a vertical cross-sectional view of the first exemplary structure after deposition of a first conductive material layer according to the first embodiment of the present disclosure.

Referring to FIG. 9, a first conductive material layer 82L comprising a first conductive material can be deposited in the backside contact trench 79 and over the alternating stack (32, 46) and the planarization dielectric layer 70. The first conductive material can be a doped semiconductor material such as doped polysilicon or a doped silicon-germanium alloy (e.g., having a dopant concentration greater than $1.0 \times 10^{17}/cm^3$). The thickness of the first conductive material layer 82L is selected such that a first cavity 79' laterally surrounded by the first conductive material layer 82L is present within the backside contact trench after formation of the first conductive material layer 82L. In one embodiment, the first conductive material layer 82L can be formed by a conformal deposition method such as chemical vapor deposition (CVD) or atomic layer deposition (ALD). In this case, the first conductive material layer 82L can have a uniform thickness throughout. In one embodiment, the bottommost portion of the first cavity 79' is vertically spaced from the surface of the substrate (9, 10) by the uniform thickness of the first conductive material layer 82L.

Figure 10:
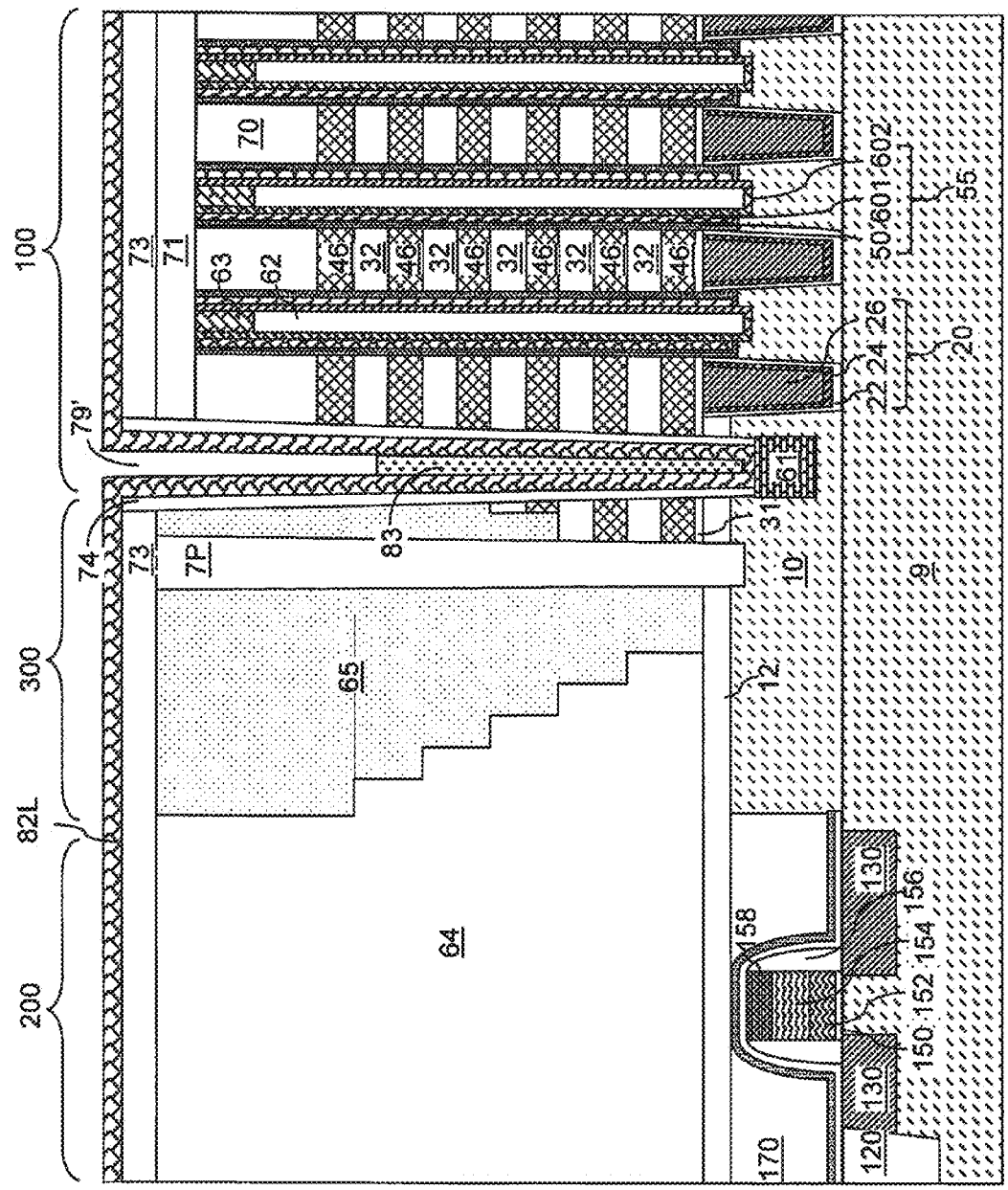
FIG. 10 is a vertical cross-sectional view of the first exemplary structure after deposition and vertical recessing of a disposable material according to the first embodiment of the present disclosure.

Referring to FIG. 10, a disposable material is applied into the first cavity 79' and optionally over the first conductive material layer 82L. As used herein, a "disposable" material refers to a temporary material that is subsequently removed. The disposable material comprises a material that is different from the material of the first conductive material layer 82L and from the material of the insulating spacer 74. In one embodiment, the disposable material comprises a material selected from a photoresist material, an organic polymer material, and an inorganic polymer material. In one embodiment, the disposable material can be a self-planarizing material that can fill the volume of the first cavity 79'. The disposable material may, or may not, cover the top surface of the first conductive material layer 82L.

Subsequently, the disposable material can be vertically recessed such that a remaining portion of the disposable material is present in the backside contact trench. The remaining portion of the disposable material in the backside contact trench constitutes a disposable material portion 83. Thus, a lower portion of the first cavity 79' is filled with the disposable material portion 83. The height of the top surface of the disposable material portion 83 can be in a range from 15% to 85% of the total height of the backside contact trench, although lesser and greater heights can also be employed.

Figure 11:
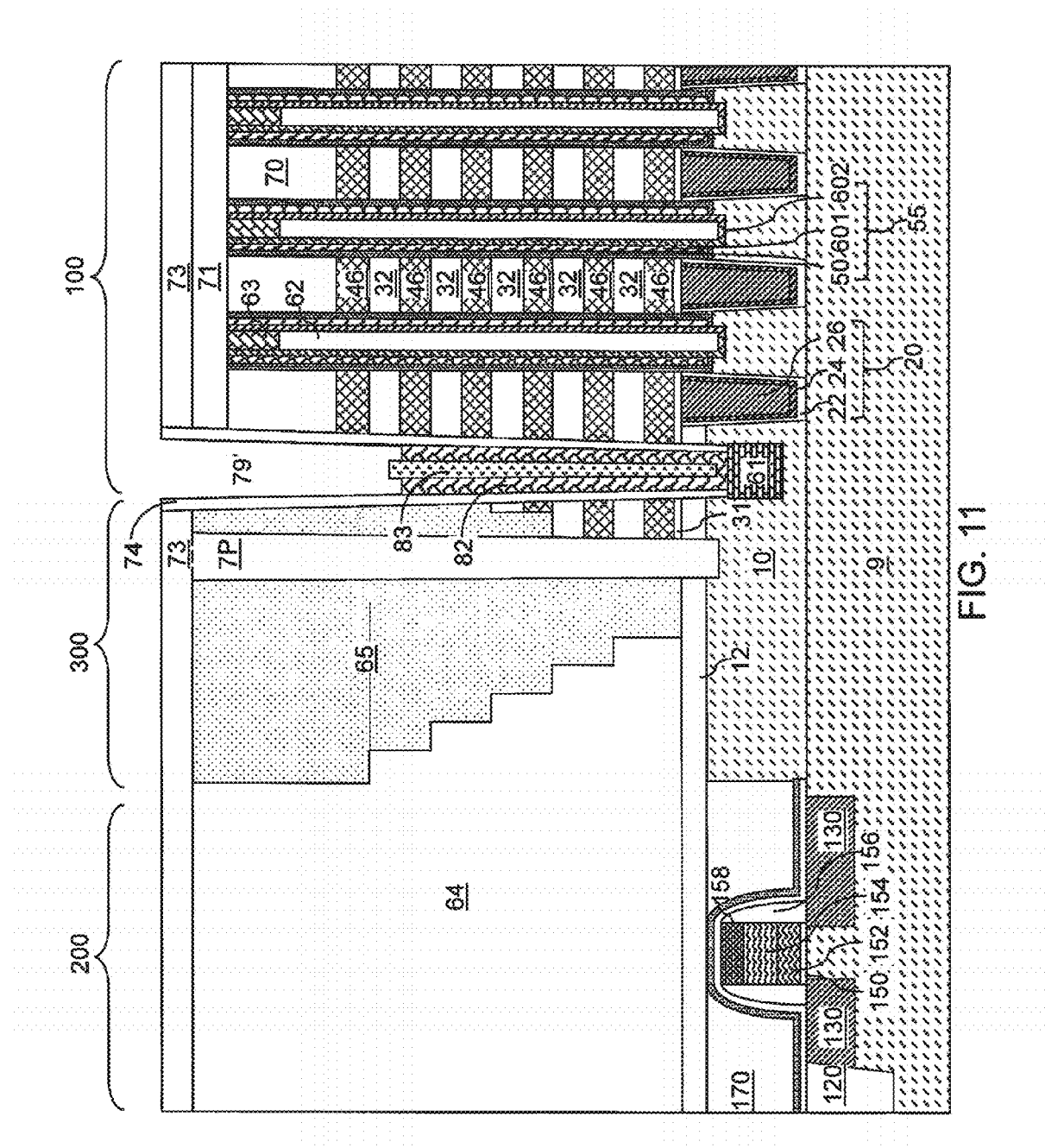
FIG. 11 is a vertical cross-sectional view of the first exemplary structure after removal of physically exposed portions of the first conductive material layer according to the first embodiment of the present disclosure.

Referring to FIG. 11, physically exposed portions of the first conductive material layer 82L can be etched by an isotropic etch process (such as a wet etch process) employing the disposable material portion 83 as an etch mask. The isotropic etch process can be selective to the dielectric material of the insulating spacer 74. The remaining portion of the first conductive material layer 82L inside the backside contact trench constitutes a lower conductive material portion 82. The lower conductive material portion 82 can be formed directly on the doped semiconductor material portion 61. In one embodiment, the lower conductive material portion 82 can comprise a first doped semiconductor material, and the doped semiconductor material portion 61 can have a second doped semiconductor material having a doping of the same conductivity type as the first doped semiconductor material. The first and second doped semiconductor material may be the same, or may be different. For example, the first doped semiconductor material can be single crystalline silicon, and the second doped semiconductor material can be polycrystalline silicon. The first and second doped semiconductor materials can have a doping of the same conductivity type, e.g., n-type. The top surface of the lower conductive material portion 82 may be recessed below the top surface of the disposable material portion 83.

Figure 12:
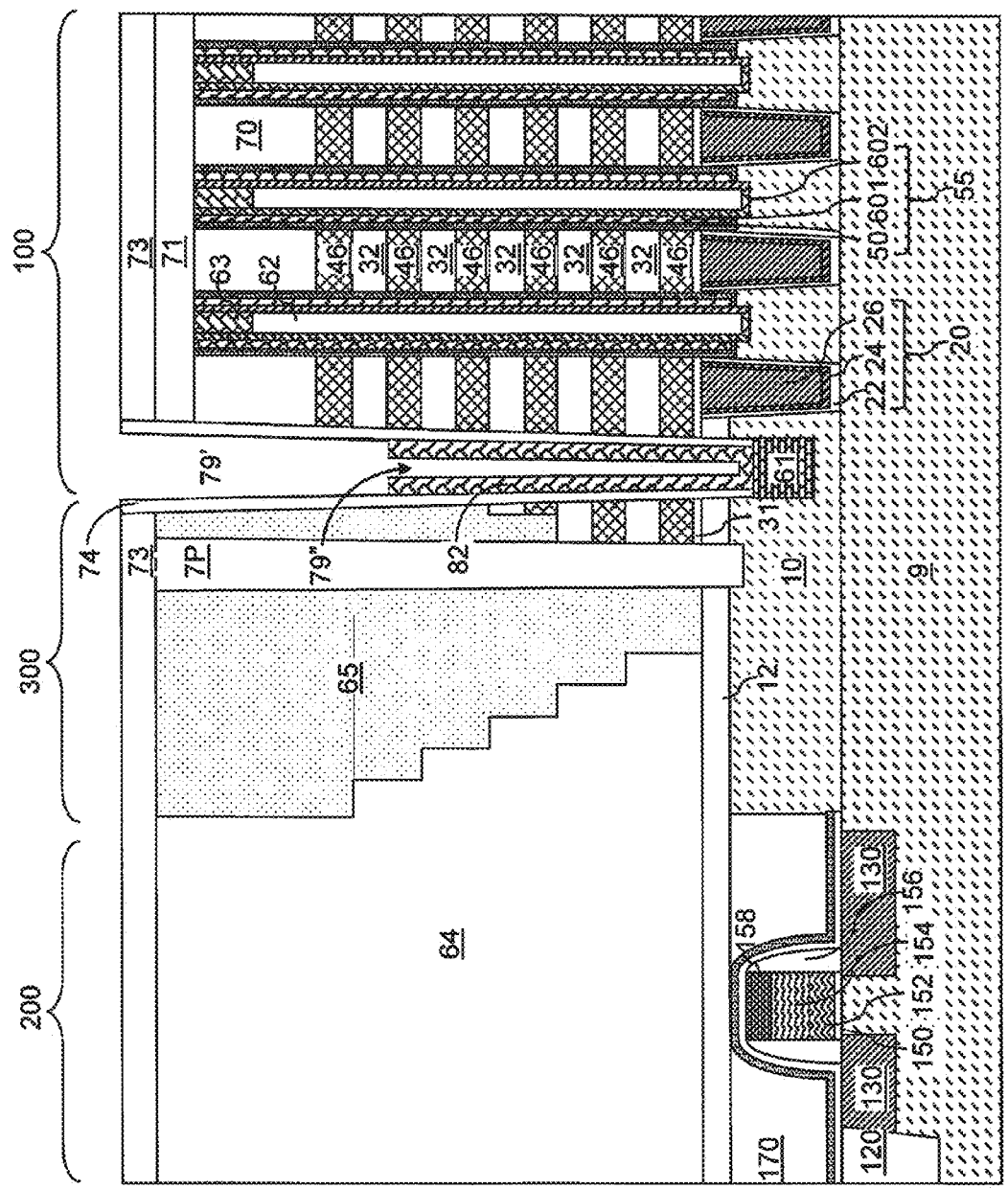
FIG. 12 is a vertical cross-sectional view of the first exemplary structure after removal of a disposable material portion according to the first embodiment of the present disclosure.

Referring to FIG. 12, the disposable material portion 83 is subsequently removed selective to the lower conductive material portion 82, for example, by ashing. A second cavity 79" laterally surrounded by the lower conductive material portion 82 can be present within the backside contact trench. In other words, the lower conductive material portion 82 laterally surrounds the second cavity 79" after removal of the disposable material portion 83.

Figure 13:
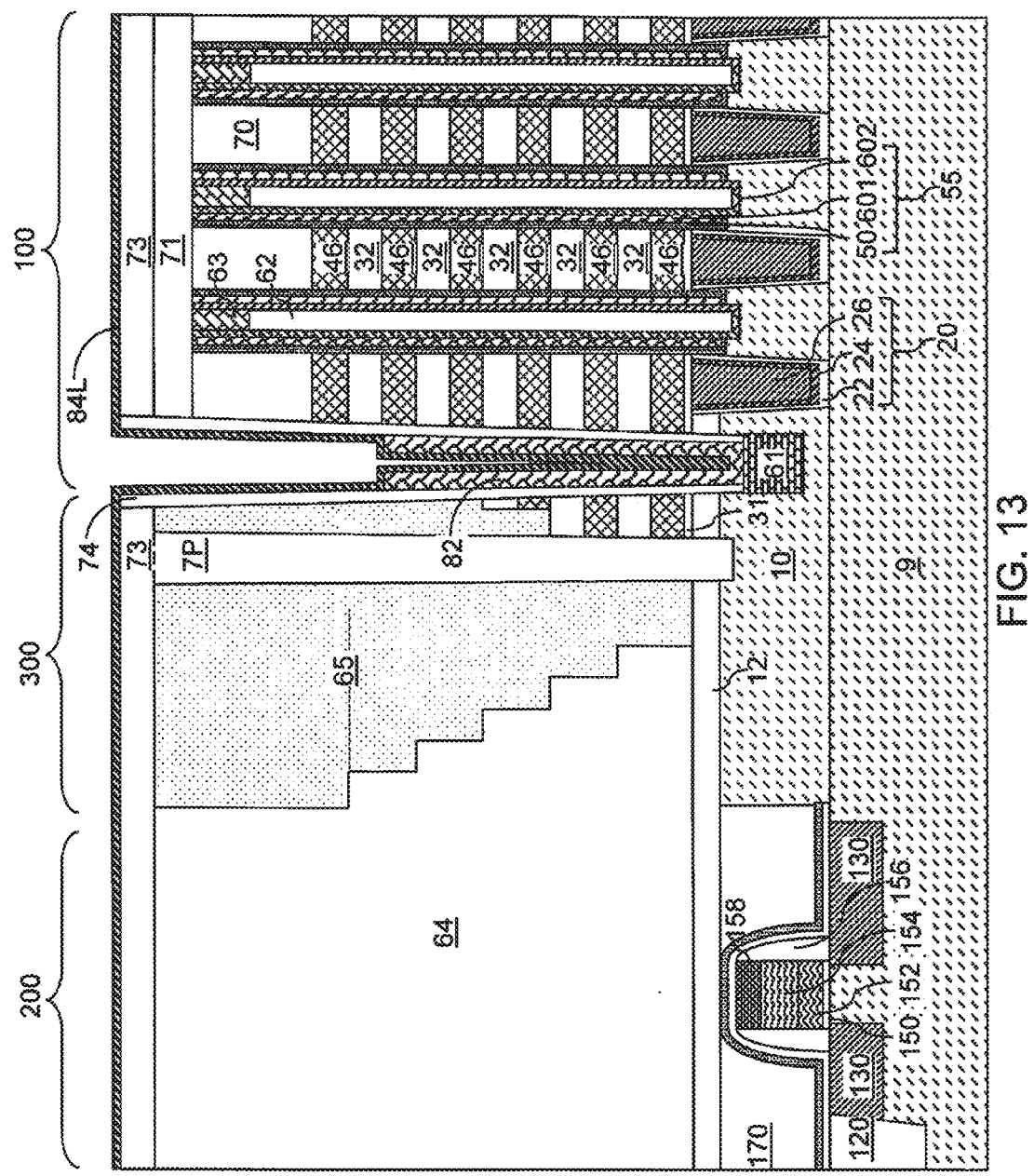
FIG. 13 is a vertical cross-sectional view of the first exemplary structure after deposition of a metallic liner layer according to the first embodiment of the present disclosure.

Referring to FIG. 13, at least one second conductive material is subsequently deposited within the unfilled volume of the backside contact trench to form an upper conductive material portion. Specifically, the second cavity 79" and an upper portion of the backside contact trench located above the lower conductive material portion 82 are filled with the at least one second conductive material.

In one embodiment, a metallic liner layer 84L is deposited directly on the inner sidewall and the top surface of the lower conductive material portion 82. In one embodiment, the metallic liner layer 84L can contact a top surface of a horizontal portion of the lower conductive material portion 82 that adjoins a bottom periphery of the inner sidewall of the lower conductive material portion 82. At least a portion of the second cavity 79" is filled with the metallic liner layer 84L. In one embodiment, the metallic liner layer 84L can comprise a conductive metallic nitride such as titanium nitride, tantalum nitride, tungsten nitride, or a combination thereof. The metallic liner layer 84L can be deposited, for example, by chemical vapor deposition or physical vapor deposition. The metallic liner layer 84L may partially fill the second cavity 79", or may fully fill the second cavity 79". The metallic liner layer 84L can be deposited on an upper portion of an inner sidewall of the insulating spacer 74 and on surfaces of the lower conductive material portion 82.

Figure 14:
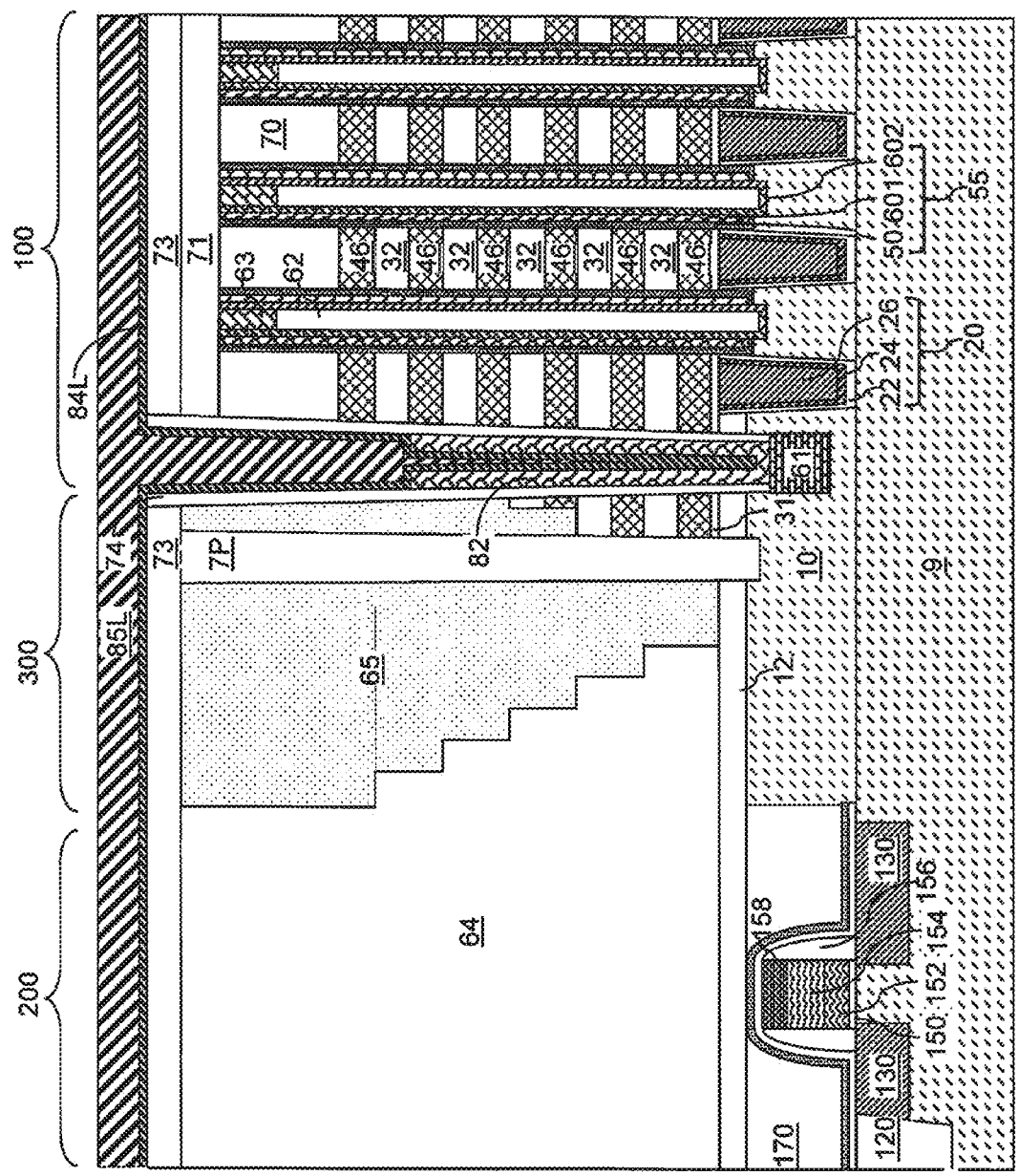
FIG. 14 is a vertical cross-sectional view of the first exemplary structure after deposition of a second conductive material layer according to the first embodiment of the present disclosure.

Referring to FIG. 14, a second conductive material layer 85L can be subsequently deposited. The second conductive material layer 85L is a conductive fill material layer that fills the remaining unfilled volume of the backside contact trench. The second conductive material layer 85L can comprise a metallic material. In one embodiment, the second conductive material layer 85L can comprise a material selected from an elemental metal and an intermetallic alloy of at least two elemental metals (such as W, Cu, Ti, and alloys thereof). The second conductive material layer 85L is formed directly on the metallic liner layer 84L, and is laterally spaced from the insulating spacer 74 by the metallic liner layer 84L. In one embodiment, a portion of the second conductive material layer 85L is deposited in the second cavity 79", i.e., the cavity located below the horizontal plane including the top surface of the lower conductive material portion 82.

Figure 15:
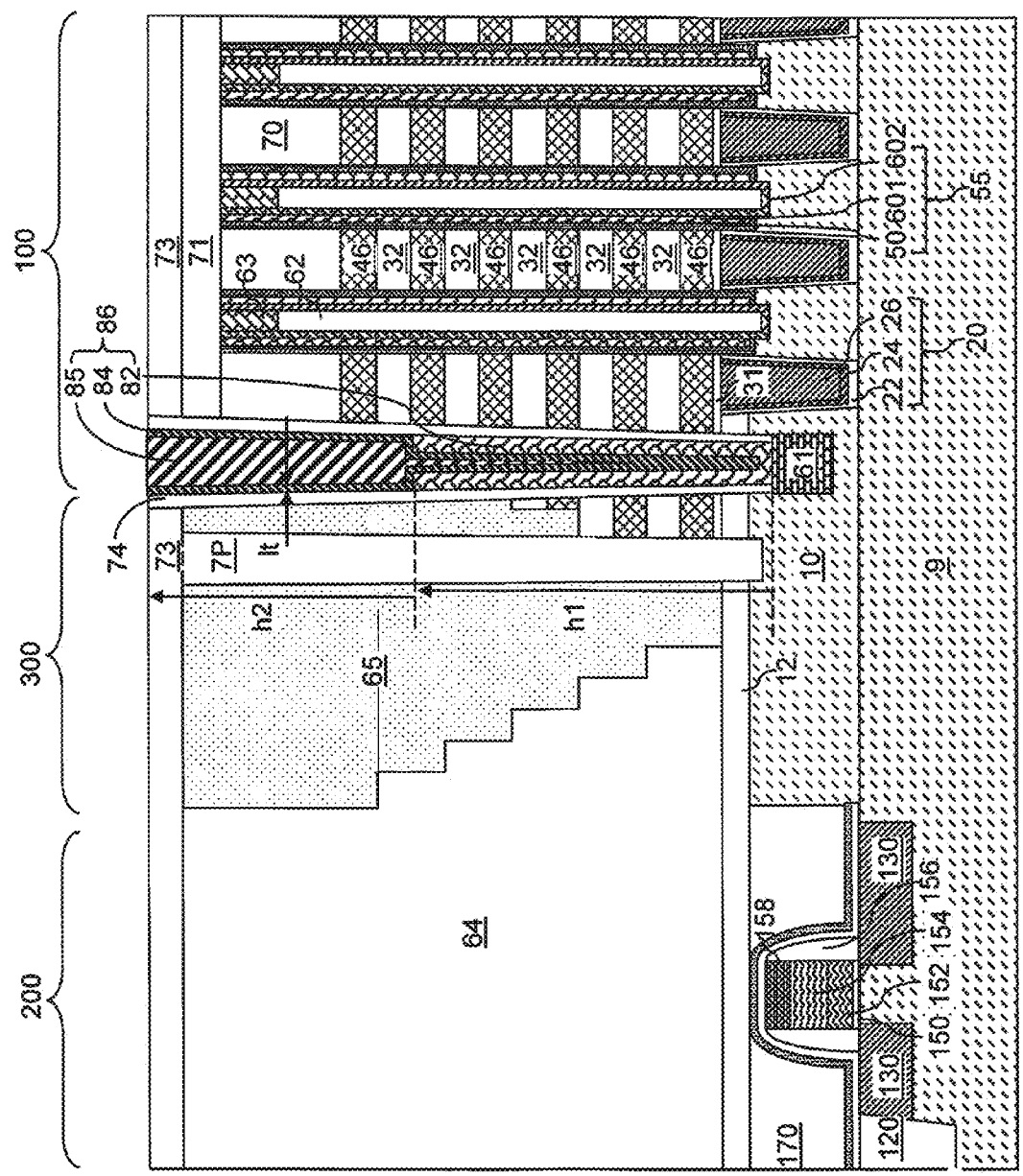
FIG. 15 is a vertical cross-sectional view of the first exemplary structure after formation of a contact via structure by planarization of the second conductive material layer according to the first embodiment of the present disclosure.

Referring to FIG. 15, portions of the second conductive material layer 85L (i.e., the conductive fill material layer) and the metallic liner layer 84L are removed from above the top surface of the at least one material layer through which the backside contact trench extends. For example, portions of the second conductive material layer 85L (i.e., the conductive fill material layer) and the metallic liner layer 84L are removed from above the top surface of the dielectric pillar material layer 73 (or the at least one dielectric cap layer 71 in case a dielectric pillar material layer is not present). The removal of the portions of the second conductive material layer 85L and the metallic liner layer 84L can be effected, for example, by chemical mechanical planarization.

A remaining portion of the metallic liner layer 84L within the backside contact trench constitutes a metallic liner 84. A remaining portion of the second conductive material layer 85L (i.e., the conductive fill material layer) within the backside contact trench constitutes a conductive fill material portion 85. The metallic liner 84 and the conductive fill material portion 85 collectively constitute the upper conductive material portion (84, 85). The upper conductive material portion (84, 85) and the lower conductive material portion 82 collectively constitute a contact via structure, which is herein referred to as a backside contact via structure 86.

The backside contact via structure 86 is formed in the backside contact trench. The backside contact via structure 86 is electrically connected to an end of the semiconductor channel (601, 602) via the doped semiconductor material portion 61, and comprises a lower conductive material portion 82 and an upper conductive material portion (84, 85). The lower conductive material portion 82 comprises a first conductive material, has a first height h1 that is less than a height of the stack (32, 46), and contains a cavity (which has the same volume as the second cavity 79" in FIG. 12) therein. The upper conductive material portion (84, 85) comprises at least one second conductive material, and fills the cavity within the lower conductive material portion 82. The upper conductive material portion (84, 85) contacts the topmost portion of the lower conductive material portion 82, and extends to the topmost portion of the backside contact trench. The lower conductive material portion 82 and the upper conductive material portion (84, 85) are formed directly on an inner sidewall of the insulating spacer.

The upper conductive material portion (84, 85) comprises the at least one second conductive material and overlies, and contacts, the lower conductive material portion 82. In one embodiment, the upper conductive material portion (84, 85) comprises a metallic liner 84 contacting the lower conductive material portion 82 and extending to the top portion of the backside contact trench, and a conductive fill material portion 85 embedded within the metallic liner 84 and vertically spaced from the lower conductive material portion 82 by the metallic liner 84. A bottom periphery of an outer sidewall of the metallic liner 82 coincides with a top periphery of an outer sidewall of the lower conductive material portion 82. The conductive fill material portion 85 is vertically spaced from the bottommost surface of the backside contact trench by a vertical distance that is greater than the lateral thickness lt of the metallic liner 82 above a top surface of the lower conductive material portion 82. The conductive fill material portion 85 can include a sub-portion that protrudes into the cavity located within the lower conductive material portion 82 and below the horizontal plane including the top surface of the lower conductive material portion 82.

The insulating spacer 74 can contact a sidewall of the backside contact trench, the outer sidewall of the lower conductive material portion 82, and an outer sidewall of the upper conductive material portion (84, 85). In one embodiment, the entire inner sidewall of the lower conductive material portion 82 can contact the metallic liner 84, the entire outer sidewall of the lower conductive material portion 82 contacts a lower portion of the insulating spacer 74, and the entire outer sidewall of a sub-portion of the metallic liner 84 located above the topmost surface of the lower conductive material portion 82 contacts an upper portion of the insulating spacer 74. Sidewalls of the insulator layers 32 and the electrically conductive layers 46 contact outer sidewalls of the insulating spacer 74.

In one embodiment, the doped semiconductor material region 61 can be a source region contacting the bottom surface of the backside contact via structure 86. The source region can be located within the substrate or above the substrate, and the source region can be electrically shorted to the semiconductor channel. The upper conductive material portion (84, 85) can extend upward from the top surface of the lower conductive material portion 82 by a second height h2. The sum of the first height h1 and the second height h2 can be the same as the total height of the backside contact trench.

Figure 16A:
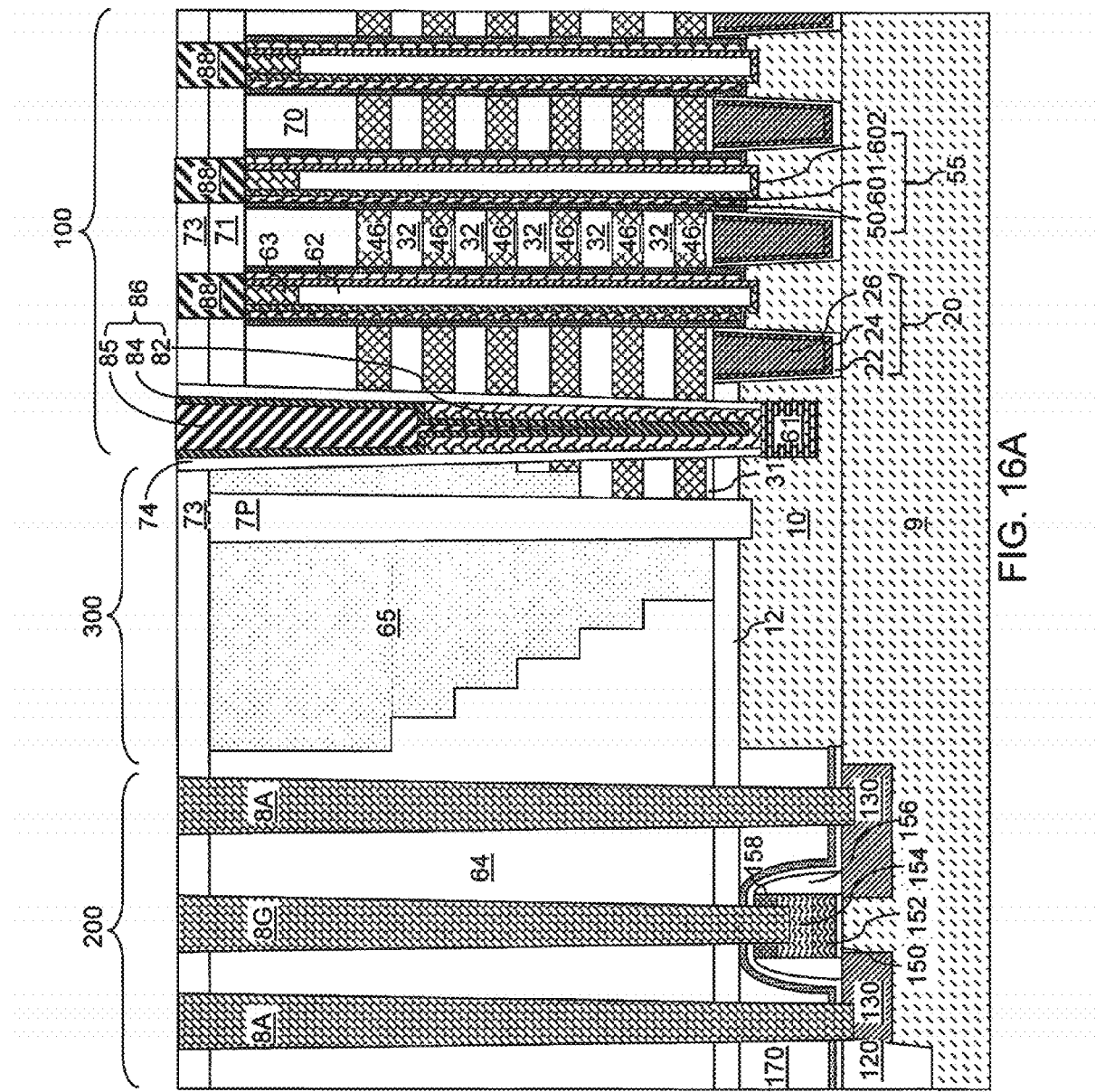
FIGS. 16A and 16B are vertical cross-sectional views of regions of the first exemplary structure after formation of various additional contact via structures according to the first embodiment of the present disclosure.
Figure 16B:
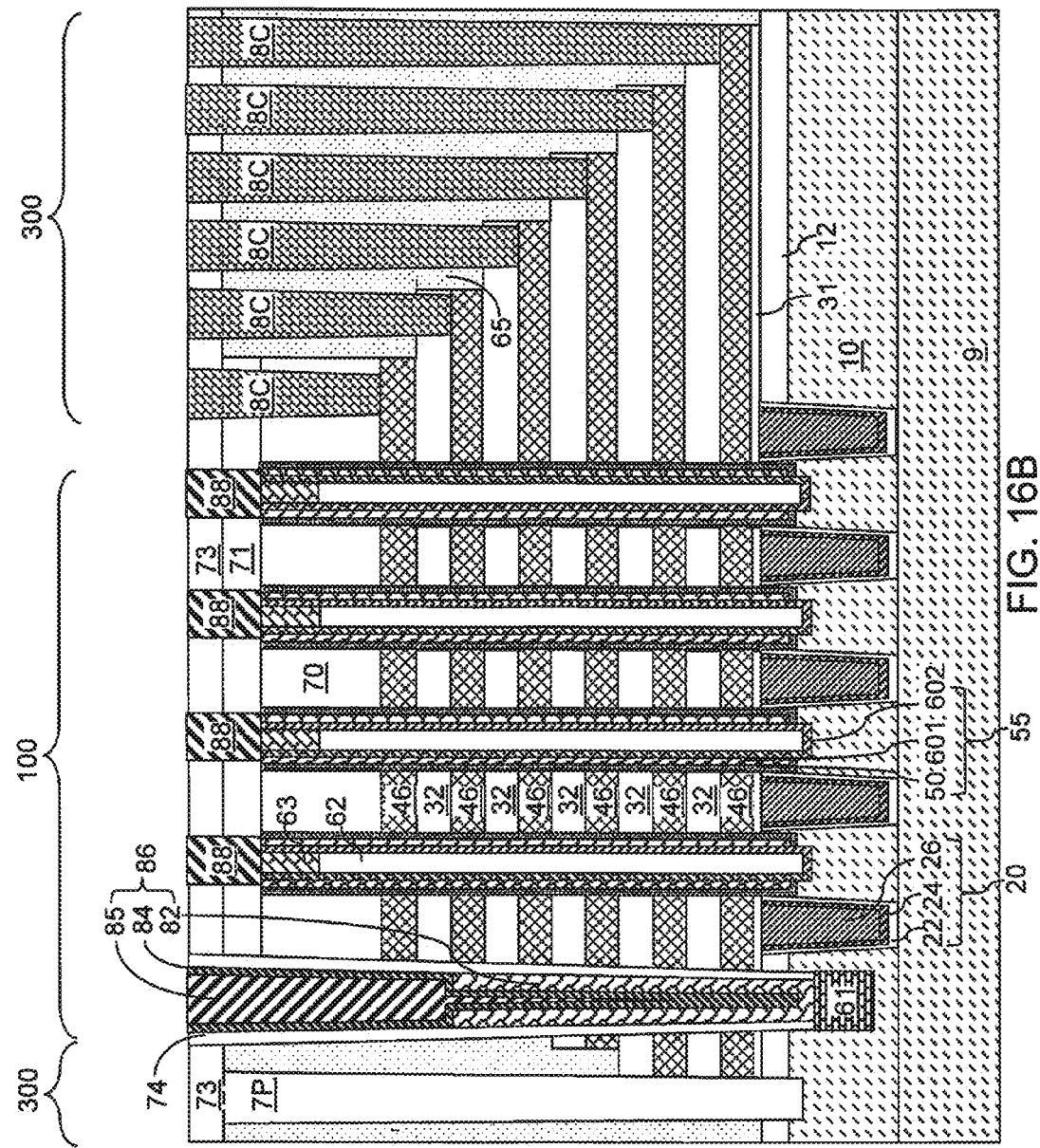

Referring to FIGS. 16A and 16B, additional contact via structures (8A, 8G, 88, 8C) can be subsequently formed. For example, a photoresist layer (not shown) can be applied over the topmost layer of the first exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The photoresist layer can be subsequently removed, for example, by ashing.

Another photoresist layer (not shown) can be applied over the first exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the first exemplary structure, and can be lithographically patterned to form openings that overlie the array of drain regions 63 in the device region 100. Drain contact via cavities can be formed through the dielectric pillar material layer 73 and the at least one dielectric cap layer 71.

The various via cavities in the peripheral device region 200, the control gate contact via cavities in the contact region 300, and the drain contact via cavities in the device region 100 can be filled with a conductive material to form various contact via structures. For example, a gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures 8C can be formed within each contact via cavity that extends to a top surface of the electrically conductive layers 46 in the contact region 300.

Additional metal interconnect structures (not shown) can be optionally formed, which can include at least one dielectric material layer, at least one conductive via structure, and at least one additional conductive line structure.

The first exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 200 including a plurality of electrically conductive contact via structures.

In case the first exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 86 can be a source line that extends through a dielectric insulated trench, i.e., the backside contact trench 79 filled with the dielectric spacer 74 and the backside contact via structure 86, in the stack to electrically contact the source region (not shown). The source region can be in contact with the horizontal portion of the semiconductor channel in an upper portion of the semiconductor material layer 10.

A drain line, as embodied as a conductive line structure (not shown) that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

Figure 17:
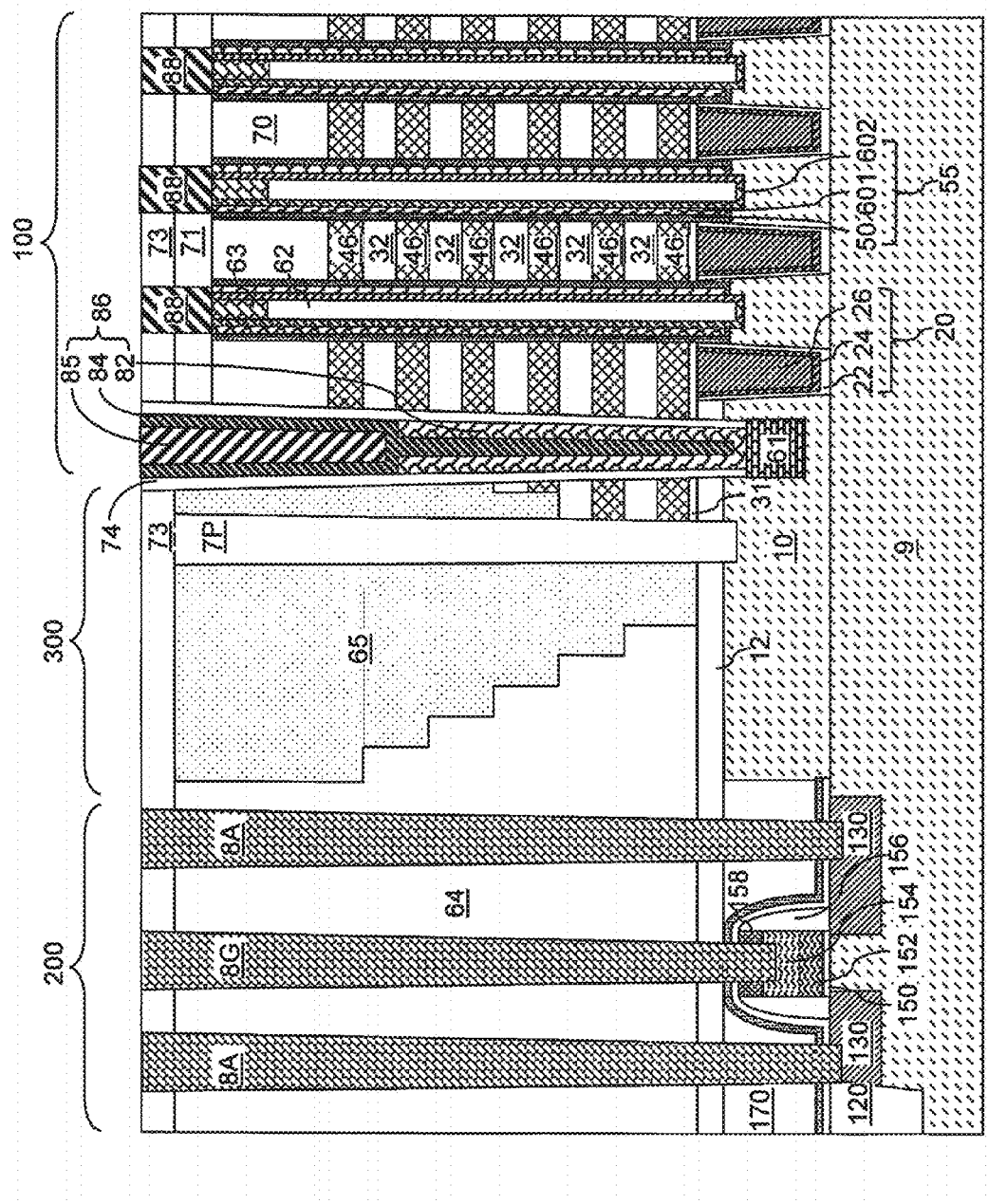
FIG. 17 is a vertical cross-sectional view of an alternate embodiment of the first exemplary structure.

Referring to FIG. 17, an alternate embodiment of the first exemplary structure can be derived from the first exemplary structure by completely filling the second cavity 79'' shown in FIG. 12 with the metallic liner layer 84L that is deposited at the processing step of FIG. 13. In this case, the entirety of the conductive fill material portion 85 can be located above the horizontal plane including the topmost surface of the lower conductive material portion 82.

Figure 18:
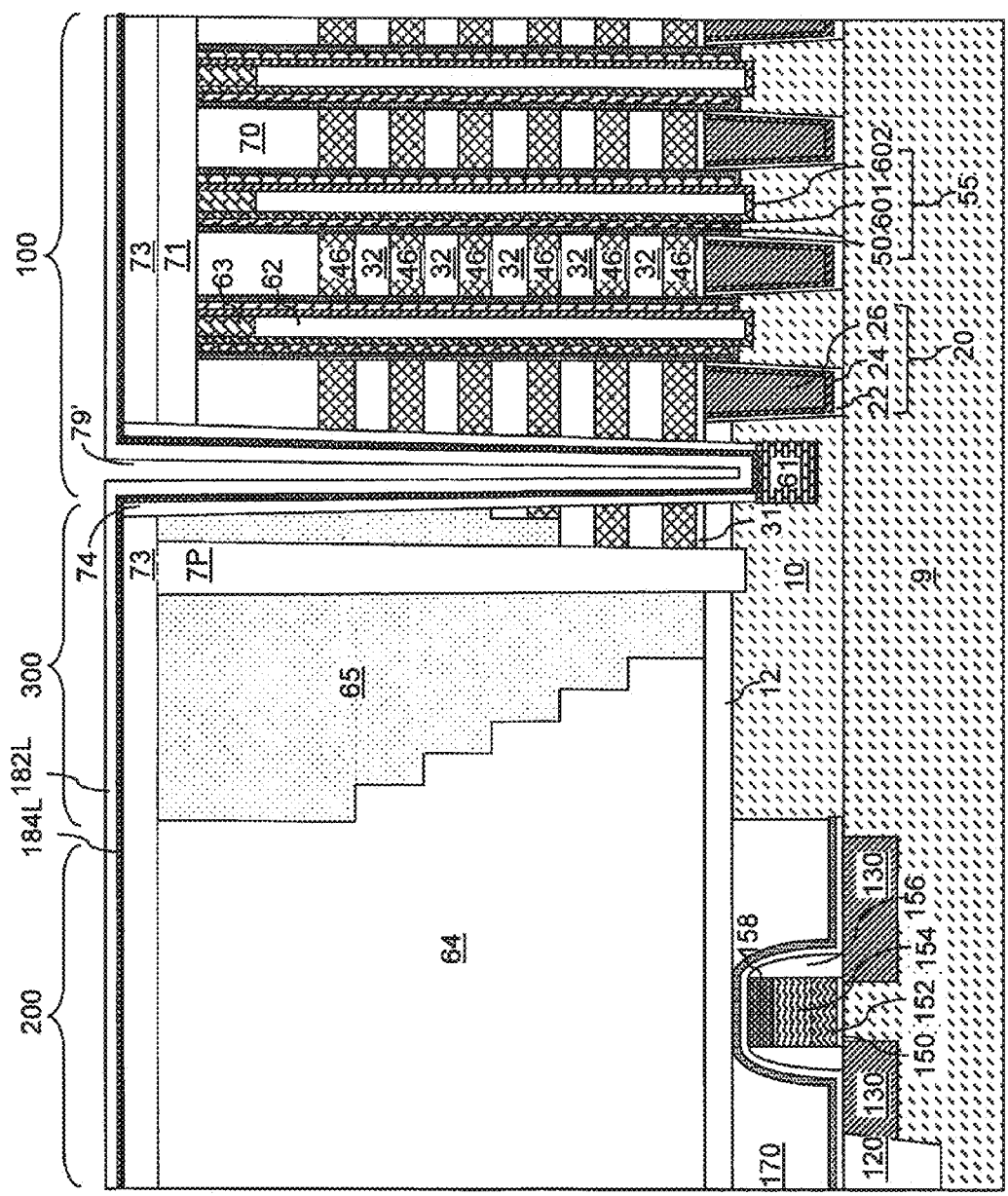
FIG. 18 is a vertical cross-sectional view of a second exemplary structure after formation of an outer metallic liner layer and a conformal dielectric material layer according to a second embodiment of the present disclosure.

Referring to FIG. 18, a second exemplary structure according to a second embodiment of the present disclosure can be derived from the first exemplary structure of FIG. 7 by depositing an outer metallic liner layer 184L and a dielectric material layer 182L. The outer metallic liner layer 184L is an optional structure that may, or may not, be employed. If the outer metallic liner layer 184 is formed, the outer metallic liner layer 184L can be deposited directly on the inner sidewall of the insulating spacer 74 and over the alternating stack (32, 46). In one embodiment, the outer metallic liner layer 184L can comprise a conductive metallic nitride such as titanium nitride, tantalum nitride, tungsten nitride, or a combination thereof. The outer metallic liner layer 184L can be deposited, for example, by chemical vapor deposition or physical vapor deposition.

The dielectric material layer 182L can be formed directly on the inner surfaces and the upper surface of the outer metallic liner layer 184L. In one embodiment, the dielectric material layer 182L can comprise a dielectric material such as silicon oxide, silicon nitride, silicon oxynitride, organosilicate glass, a dielectric metal oxide, or a combination thereof. In one embodiment, the dielectric material of the dielectric material layer 182L can be silicon oxide. In one embodiment, the dielectric material layer 182L can be deposited by a conformal deposition method such as chemical vapor deposition. In one embodiment, the dielectric material layer 182L can be formed by a conformal deposition process and have a uniform thickness throughout, i.e., can be a conformal dielectric material layer.

The combination of the outer metallic liner layer 184L and the dielectric material layer 182L does not completely fill the backside contact via trench. Thus, a first cavity 79' is present in a portion of the backside contact trench that is not filled with the dielectric material layer 182L.

Figure 19:
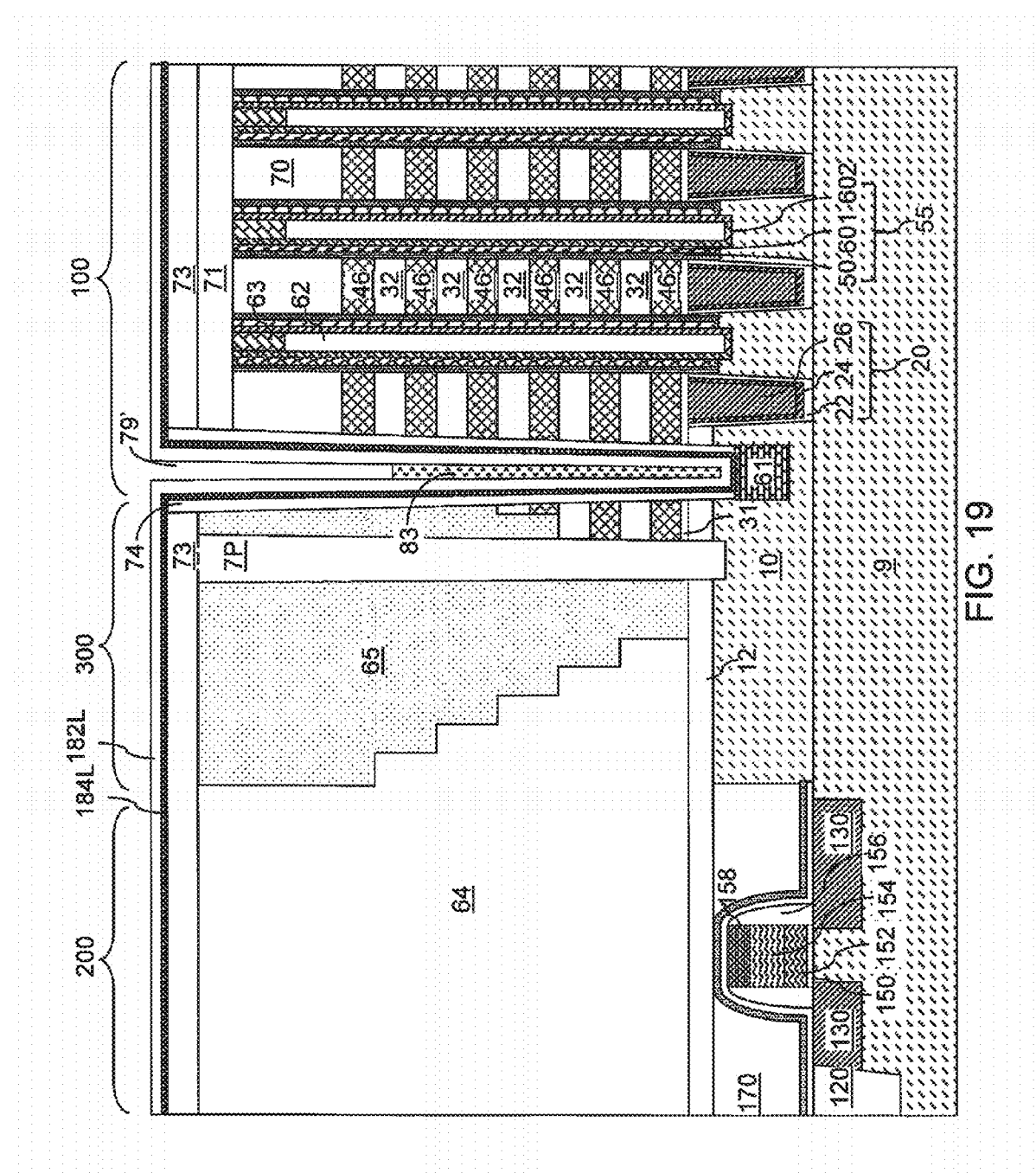
FIG. 19 is a vertical cross-sectional view of the second exemplary structure after application and vertical recessing of a disposable material according to the second embodiment of the present disclosure.

Referring to FIG. 19, a disposable material is applied into the first cavity 79' and optionally over the dielectric material layer 182L. The disposable material comprises a material that is different from the material of the dielectric material layer 182L and from the material of the outer metallic liner layer 184L. In one embodiment, the disposable material comprises a material selected from a photoresist material, an organic polymer material, and an inorganic polymer material. In one embodiment, the disposable material can be a self-planarizing material that can fill the volume of the first cavity 79'. The disposable material may, or may not, cover the top surface of the dielectric material layer 182L.

Subsequently, the disposable material can be vertically recessed such that a remaining portion of the disposable material is present in the backside contact trench. The remaining portion of the disposable material in the backside contact trench constitutes a disposable material portion 83. Thus, a lower portion of the first cavity 79' is filled with the disposable material portion 83. The height of the top surface of the disposable material portion 83 can be in a range from 15% to 85% of the total height of the backside contact trench, although lesser and greater heights can also be employed.

Figure 20:
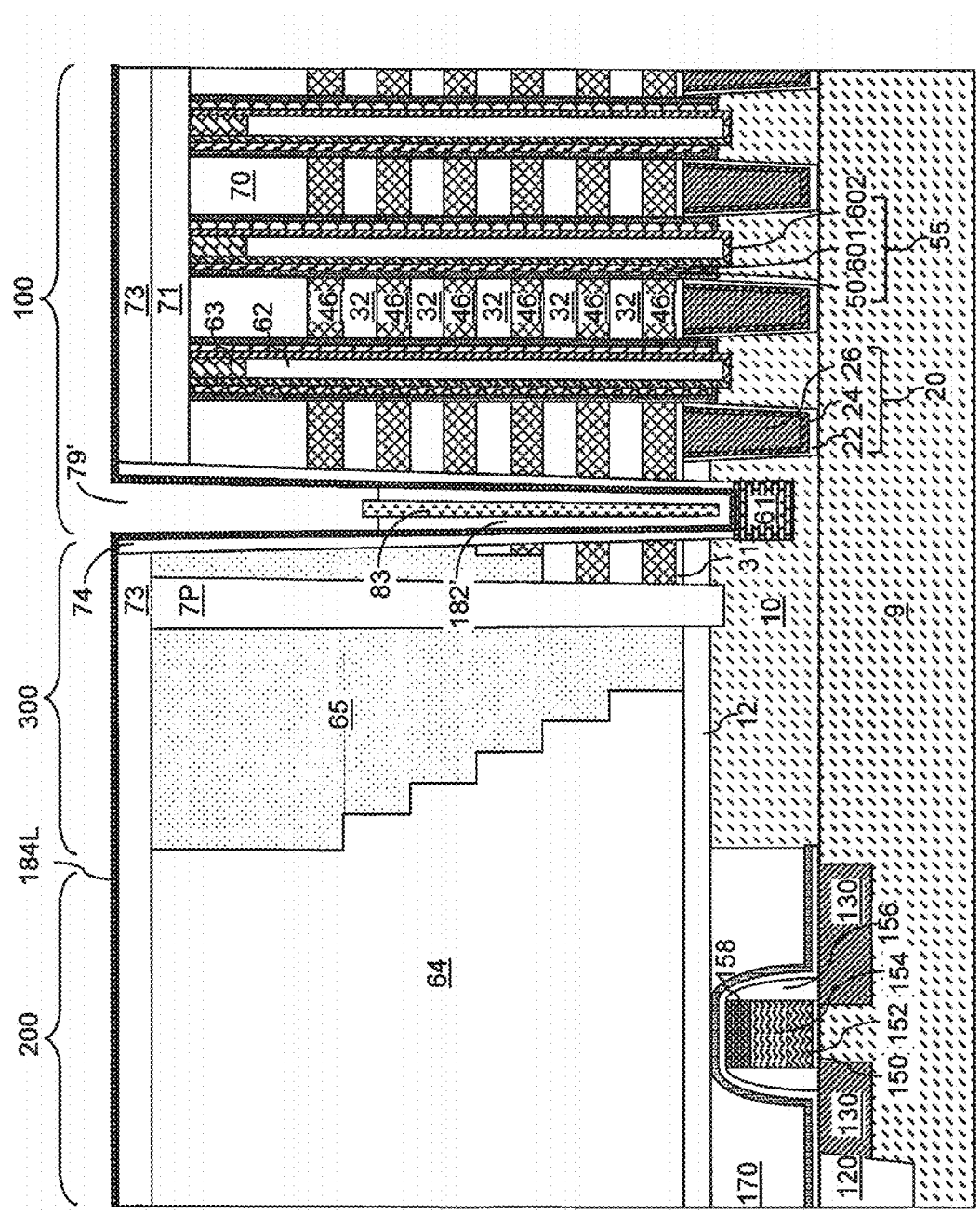
FIG. 20 is a vertical cross-sectional view of the second exemplary structure after etching physically exposed portions of the conformal dielectric material layer according to the second embodiment of the present disclosure.

Referring to FIG. 20, physically exposed portions of the dielectric material layer 182L can be etched by an isotropic etch process (such as a wet etch process) employing the disposable material portion 83 as an etch mask. The isotropic etch process can be selective to the material of the outer metallic liner layer 184L. The remaining portion of the dielectric material layer 182L inside the backside contact trench constitutes a dielectric material portion 182'. The dielectric material portion 182' can be formed directly on the doped semiconductor material portion 61. The dielectric material portion 182' underlies, and is vertically spaced from, a horizontal plane including the topmost surface of the at least one material layer (32, 46, 71, 73), which can be, for example, the top surface of the dielectric pillar material layer 73. The top surface of the dielectric material portion 182' may be recessed below the top surface of the disposable material portion 83.

Figure 21:
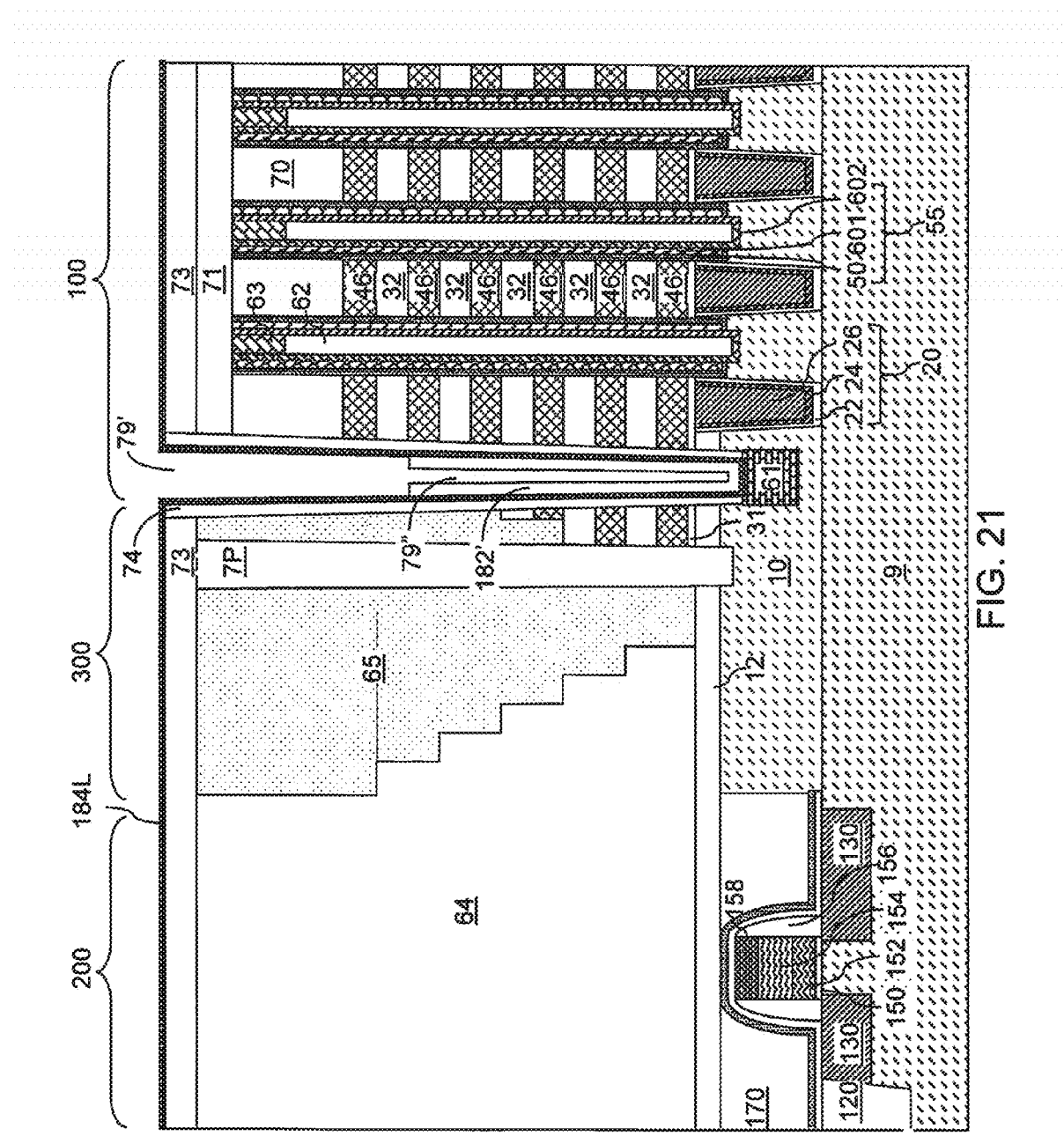
FIG. 21 is a vertical cross-sectional view of the second exemplary structure after removal of a disposable material portion according to the second embodiment of the present disclosure.

Referring to FIG. 21, the disposable material portion 83 is subsequently removed selective to the dielectric material portion 182', for example, by ashing. A second cavity 79" laterally surrounded by the disposable material portion 83 can be present within the backside contact trench. In other words, the dielectric material portion 182' laterally surrounds the second cavity 79" after removal of the disposable material portion 83. A top surface of a bottom portion of the dielectric material portion 182' is present at the bottom of the second cavity 79" that is laterally surrounded by the dielectric material portion 182'.

Figure 22:
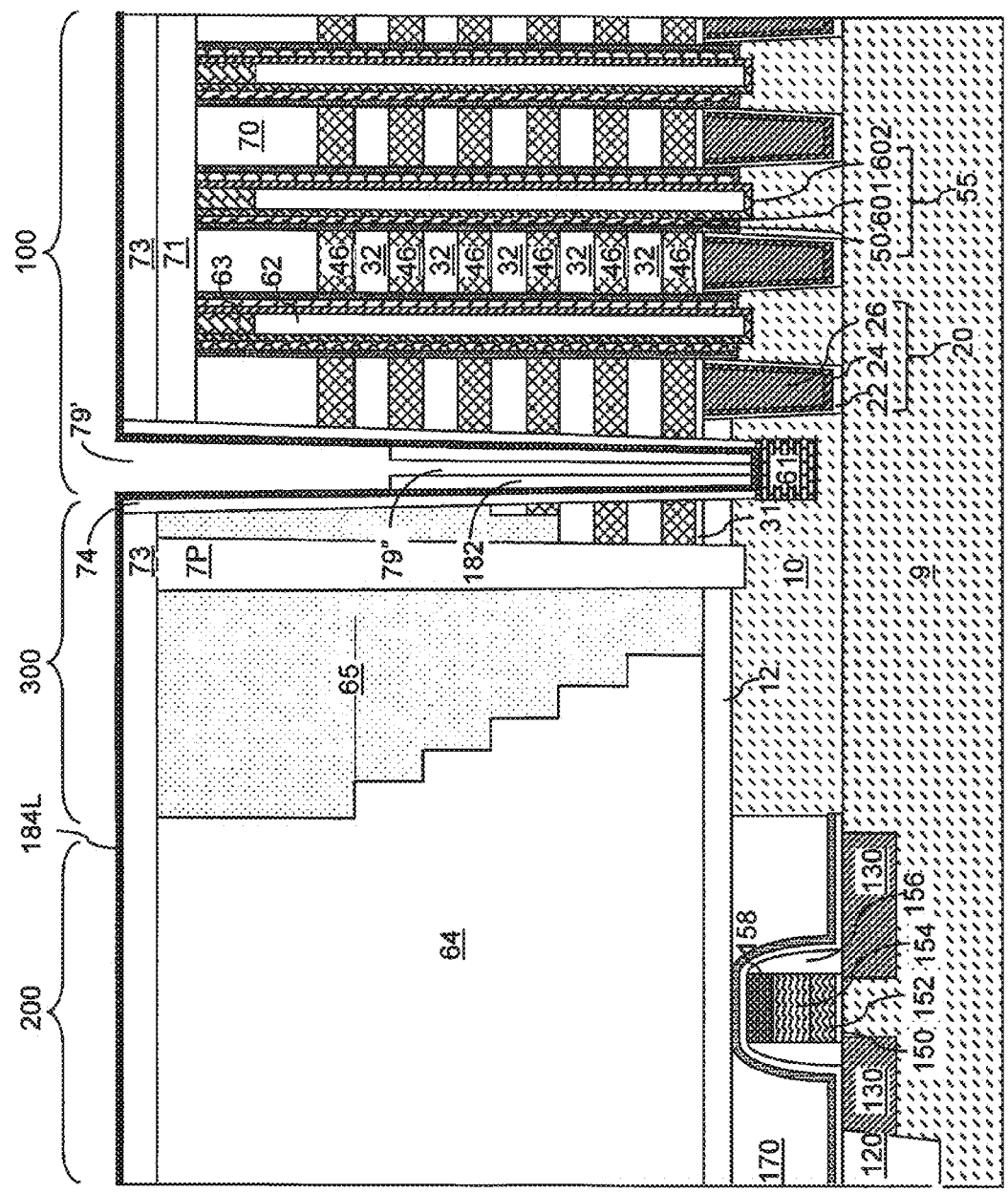
FIG. 22 is a vertical cross-sectional view of the second exemplary structure after an anisotropic etch that forms a dielectric spacer according to the second embodiment of the present disclosure.

Referring to FIG. 22, an anisotropic etch (e.g., a sidewall spacer etch) that etches the dielectric material portion 182' is subsequently performed to form a dielectric spacer 182. A horizontal portion of the dielectric material portion 182' is removed from a bottom region of the backside contact trench. In other words, the dielectric spacer 182 is a remaining portion of the dielectric material portion 182'. The dielectric spacer 182 has an opening therethrough, and is formed within the outer metallic liner layer 184L. In case the outer metallic liner layer 184L is omitted, a portion of the doped semiconductor region 61L can be physically exposed at the bottom of the opening through the dielectric spacer 182. The topmost surface of the dielectric spacer 182 is recessed below the topmost surface of the at least material layer (32, 46, 71, 73). A top surface of a bottom portion of the outer metallic liner layer 184L is present at the bottom of the second cavity 79" that is laterally surrounded by the dielectric spacer 182.

Figure 23:
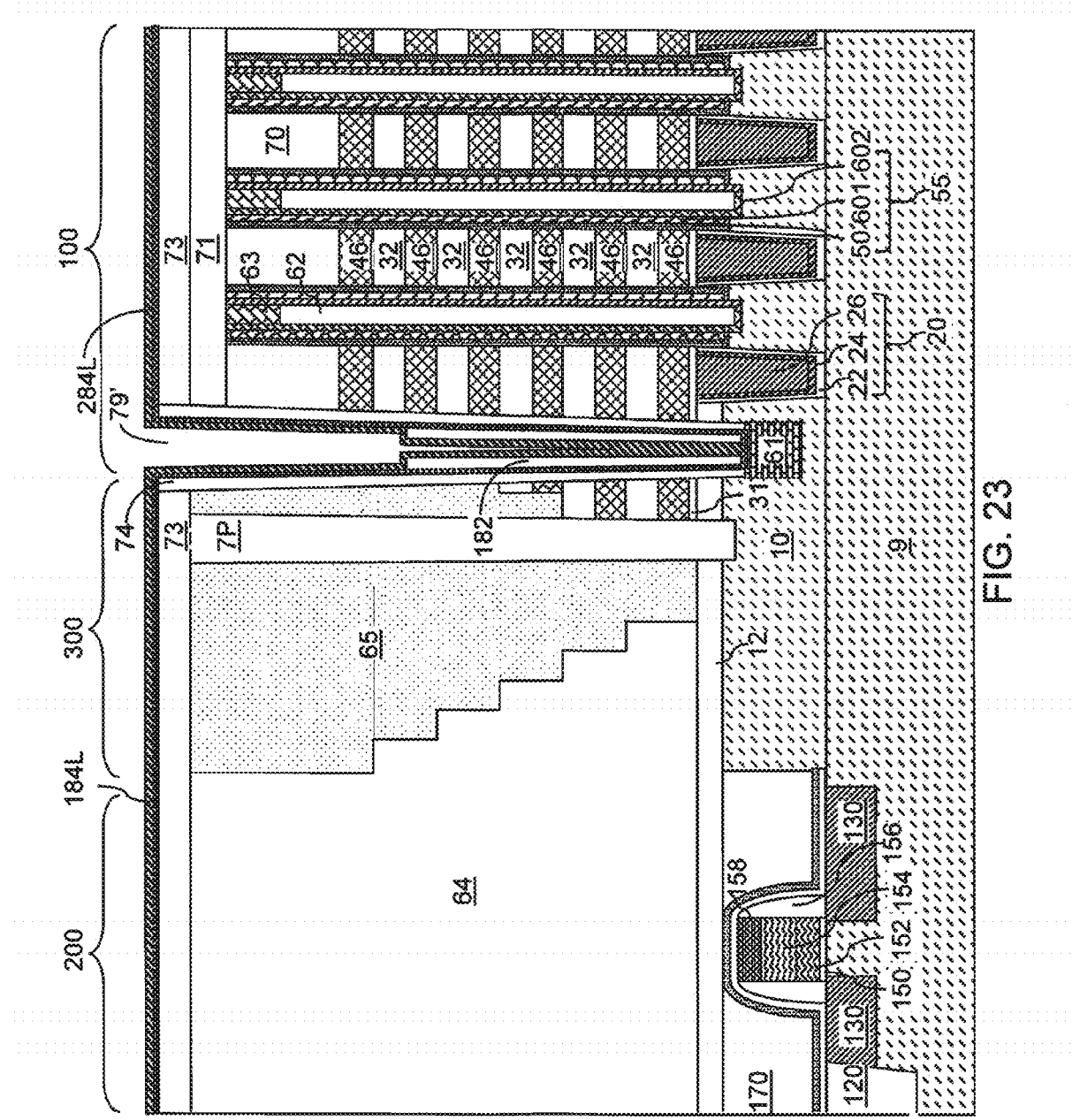
FIG. 23 is a vertical cross-sectional view of the second exemplary structure after formation of an inner metallic spacer according to the second embodiment of the present disclosure.

Referring to FIG. 23, at least one conductive material is subsequently deposited within the unfilled volume of the backside contact trench. Specifically, the second cavity 79" and an upper portion of the backside contact trench located above the dielectric spacer 182 are filled with the at least one conductive material.

In one embodiment, an inner metallic liner layer 284L is deposited directly on the inner sidewall and the top surface of the dielectric spacer 182, and directly on the inner sidewall of the outer metallic liner layer 184L. In one embodiment, the inner metallic liner layer 284L can contact a top surface of a bottom portion of the outer metallic liner layer 184L that underlies the dielectric spacer 182. At least a portion of the second cavity 79" is filled with the inner metallic liner layer 284L. In one embodiment, the inner metallic liner layer 284L can comprise a conductive metallic nitride such as titanium nitride, tantalum nitride, tungsten nitride, or a combination thereof. The inner metallic liner layer 284L can be deposited, for example, by chemical vapor deposition or physical vapor deposition. The inner metallic liner layer 284L may partially fill the second cavity 79", or may fully fill the second cavity 79". The inner metallic liner layer 284L can be deposited on an upper portion of an inner sidewall of the outer metallic liner layer 184L, on surfaces of the dielectric spacer 82, and on a top surface of a horizontal bottom portion of the outer metallic liner layer 184L. The outer metallic liner layer and the inner metallic layer encapsulate the dielectric spacer.

Figure 24:
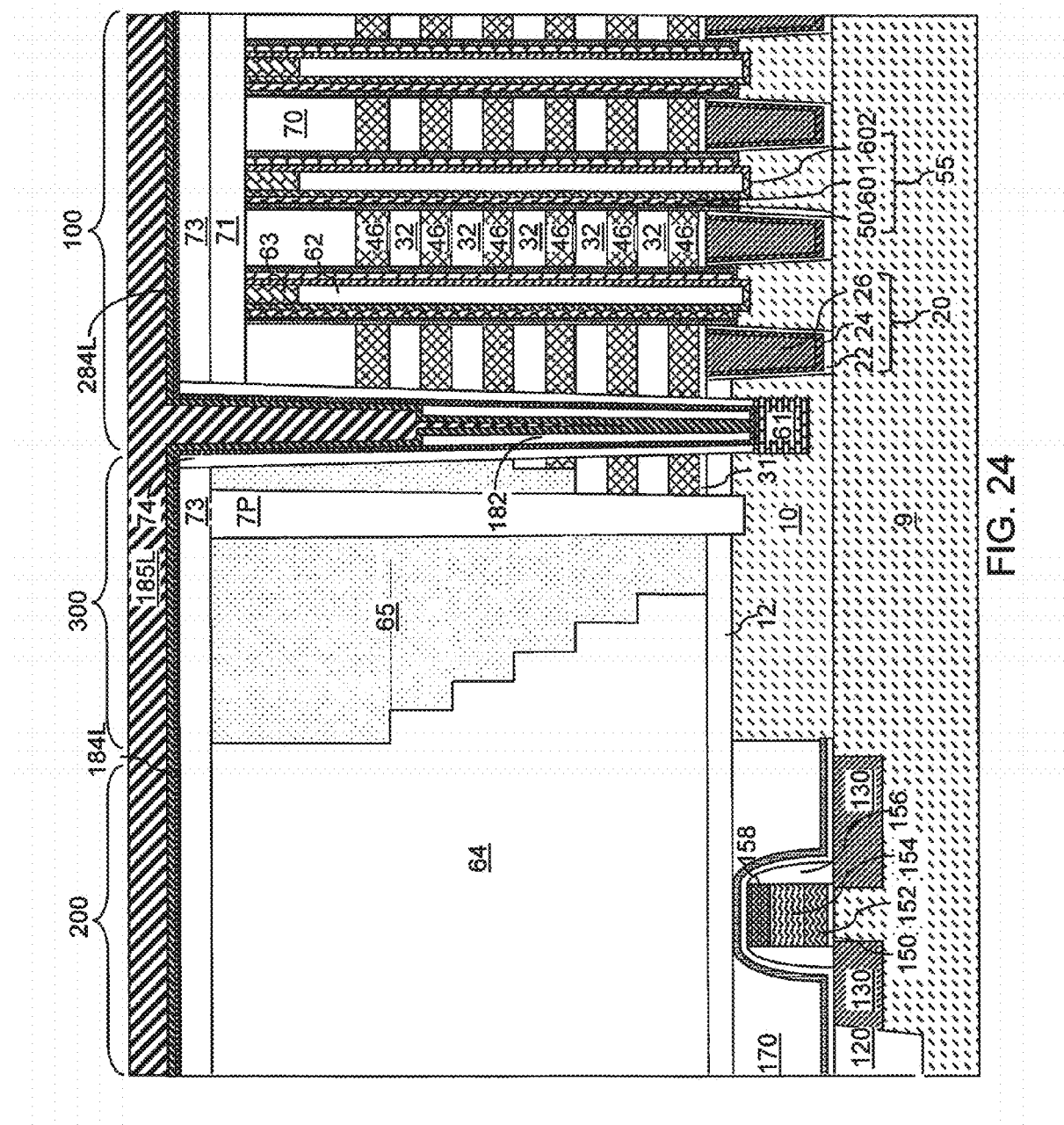
FIG. 24 is a vertical cross-sectional view of the second exemplary structure after deposition of a conductive material layer according to the second embodiment of the present disclosure.

Referring to FIG. 24, a conductive material layer 185L can be subsequently deposited. The conductive material layer 185L is a conductive fill material layer that fills the remaining unfilled volume of the backside contact trench. The conductive material layer 185L can comprise a metallic material. In one embodiment, the conductive material layer 185L can comprise a material selected from an elemental metal and an intermetallic alloy of at least two elemental metals (such as W, Ti, Cu, and alloys thereof). The conductive material layer 185L is formed directly on the inner metallic liner layer 284L, and is laterally spaced from the insulating spacer 74 by the inner metallic liner layer 284L. In one embodiment, a portion of the conductive material layer 185L is deposited in the second cavity 79", i.e., the cavity located below the horizontal plane including the top surface of the dielectric spacer 182. A portion of the conductive fill material of the conductive material layer 185L is deposited within the volume of the opening through the dielectric spacer 182, which is the volume of the second cavity 79".

Figure 25:
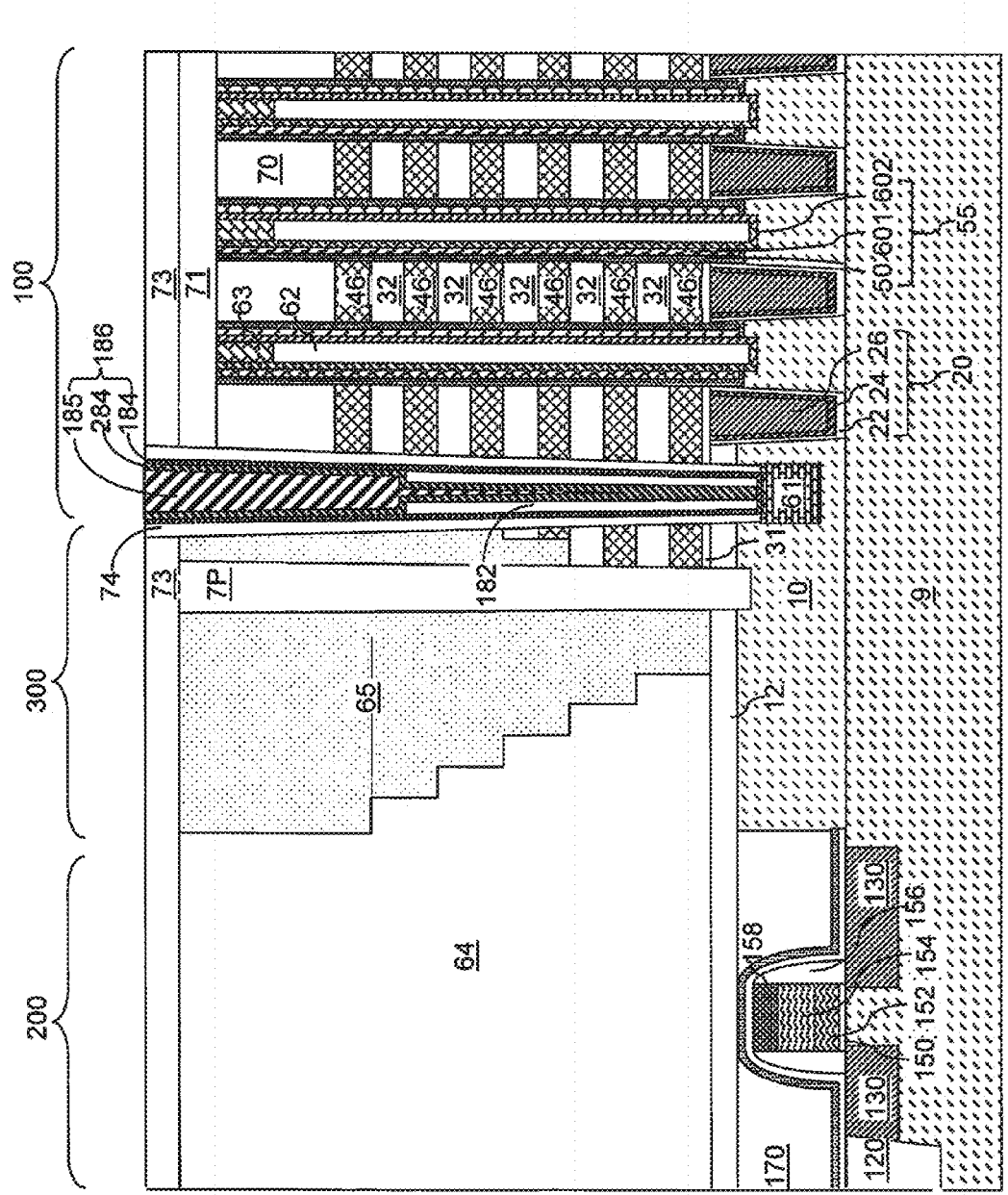
FIG. 25 is a vertical cross-sectional view of the second exemplary structure after formation of a contact via structure by a planarization process according to the second embodiment of the present disclosure.

Referring to FIG. 25, portions of the conductive material layer 185L (i.e., the conductive fill material layer), the outer metallic liner layer 184L, and the inner metallic liner layer 284L are removed from above the top surface of the at least one material layer through which the backside contact trench extends. For example, portions of the conductive material layer 185L (i.e., the conductive fill material layer) and the inner metallic liner layer 284L are removed from above the top surface of the dielectric pillar material layer 73 (or the at least one dielectric cap layer 71 in case a dielectric pillar material layer is not present). The removal of the portions of the conductive material layer 185L and the inner metallic liner layer 284L can be effected, for example, by chemical mechanical planarization.

A remaining portion of the inner metallic liner layer 284L within the backside contact trench constitutes an inner metallic liner 284. A remaining portion of the conductive material layer 185L (i.e., the conductive fill material layer) within the backside contact trench constitutes a conductive fill material portion 185. A remaining portion of the outer metallic liner layer 184L constitutes an outer metallic liner 184. The inner metallic liner 284, the conductive fill material portion 185, and the outer metallic liner 184 collectively constitute a contact via structure, which is herein referred to as a backside contact via structure 186.

The second exemplary structure comprises a stack (32, 46) of alternating layers comprising insulating layers 32 and electrically conductive layers 46 and located over a substrate (9, 10), a trench (i.e., a backside contact trench) vertically extending through the stack (9, 10), a dielectric spacer 182 including an opening therethrough and located at a bottom portion of the trench, and a contact via structure 186, i.e., the backside contact via structure, located in the trench. The backside contact via structure 186 is electrically connected to an end of the semiconductor channel (601, 602) via a doped semiconductor region 61 (which can be a source region). A first portion of the backside contact via structure 186 fills the opening through the dielectric spacer 182, and a second portion of the backside contact via structure 186 overlies the dielectric spacer 182.

In one embodiment, the outer metallic liner 184 contacts an outer sidewall of the dielectric spacer 182. In one embodiment, the outer metallic liner 184 can extend from a bottommost surface of the backside contact via structure 186 to the topmost surface of the backside contact via structure 186. The backside contact via structure 186 can comprise an inner metallic liner 284 contacting an inner sidewall of the dielectric spacer 182 within the opening of the dielectric spacer 182. The backside contact via structure 186 can further comprise a conductive fill material portion 185 embedded within the inner metallic liner 284 and spaced from the dielectric spacer 182 by the inner metallic liner 284.

In one embodiment, the inner metallic liner 284 contacts a top surface of a horizontal portion of the outer inner metallic liner 184 that underlies the dielectric spacer 182. In one embodiment, the inner metallic liner 284 contacts a portion of an inner sidewall of the outer inner metallic liner 184 that is located above the top surface of the dielectric spacer 182. In one embodiment, the inner metallic liner 284 and the outer metallic liner 184 contact all surfaces of the dielectric spacer 182. Thus, the dielectric spacer 182 is encapsulated by the combination of the inner metallic liner 284 and the outer inner metallic liner 184. In one embodiment, the bottom periphery of an outer sidewall of the inner metallic liner 284 coincides with a top periphery of an outer sidewall of the dielectric spacer 182. In one embodiment, the inner metallic liner 284 comprises a conductive metallic nitride, and the conductive fill material portion 185 comprises a material selected from an elemental metal and an intermetallic alloy of at least two elemental metals.

In one embodiment, the backside contact via structure 186 comprises an inner metallic liner 284 contacting an inner sidewall of the dielectric spacer 182 within the opening of the dielectric spacer 182, and a conductive fill material portion 185 embedded within the inner metallic liner 284 and spaced from the dielectric spacer 182 by the inner metallic liner 284. A portion of the conductive material fill portion protrudes into the opening in the dielectric spacer 182. The insulating spacer 74 contacts a sidewall of the backside contact trench and an outer sidewall of the backside contact via structure 186. Sidewalls of the insulator layers 32 and the electrically conductive layers 46 contact outer sidewalls of the insulating spacer 74.

In one embodiment, the doped semiconductor material region 61 can be a source region contacting the bottom surface of the backside contact via structure 186. The source region can be located within the substrate or above the substrate, and the source region can be electrically shorted to the semiconductor channel.

Figure 26:
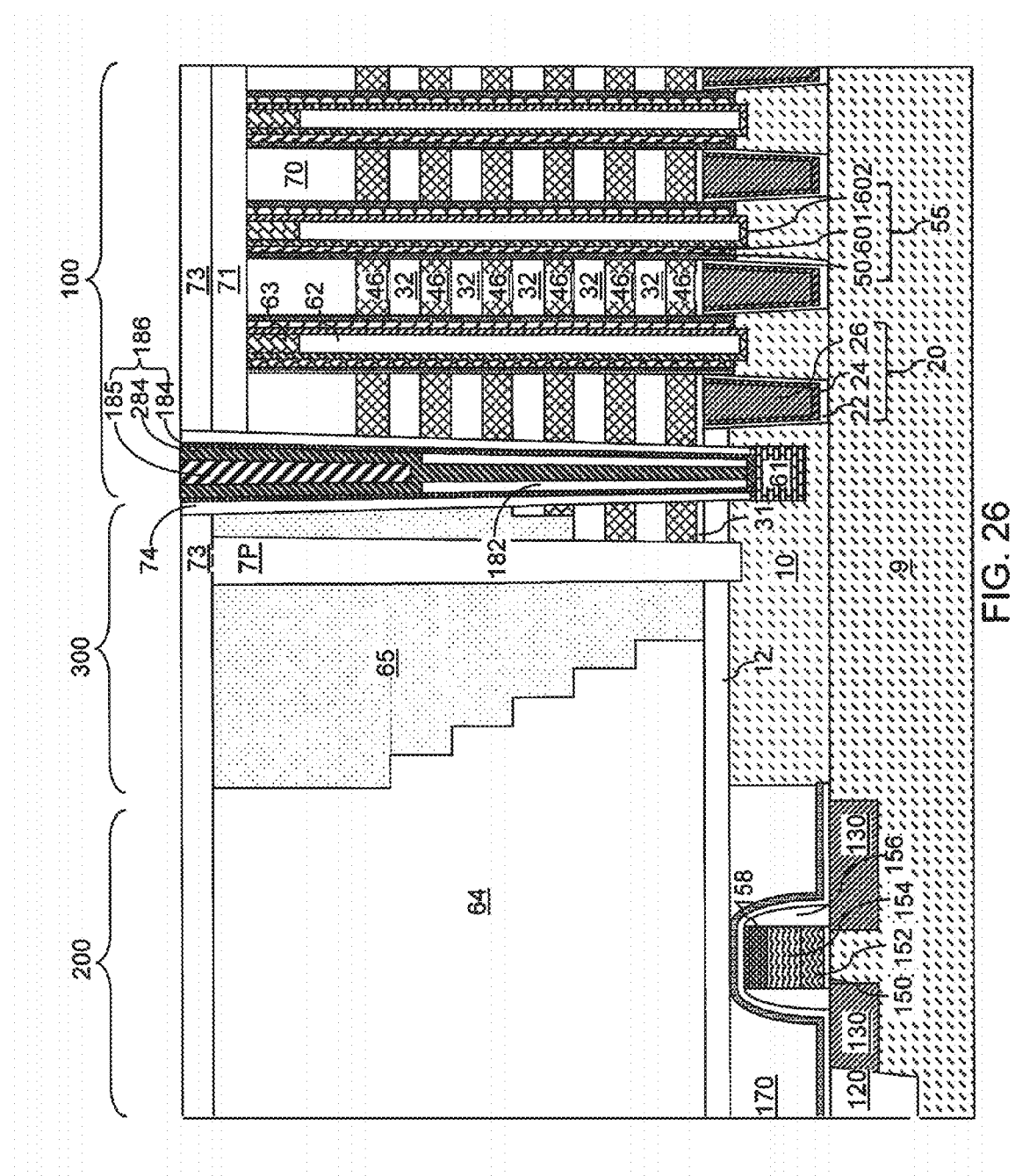
FIG. 26 is a vertical cross-sectional view of an alternate embodiment of the second exemplary structure.

Referring to FIG. 26, an alternate embodiment of the second exemplary structure can be derived from the second exemplary structure by completely filling the second cavity 79" shown in FIG. 12 with the inner metallic liner layer 284L that is deposited at the processing step of FIG. 23. The inner metallic liner 284 fills the entirety of the opening in the dielectric spacer 182. In this case, the entirety of the conductive fill material portion 185 can be located above the horizontal plane including the topmost surface of the dielectric spacer 182.

The advantages of the embodiments of the disclosure include prevention or reduction of warpage of the substrate relative to other methods of forming contact via structures. Specifically, if the entire backside contact via structure (e.g., source electrode) is formed from a material under one type of stress, such as compressive or tensile stress, then this stress may be imposed on the substrate, which results in substrate warpage. For example, tungsten via structure material is typically under tensile stress in the device. To counteract the stress imposed by the tungsten via structure material on the substrate, the trench is at least partially filled with a material under an opposite (e.g., compressive) stress, such as a first conductive material (e.g., polysilicon) portion 82 or dielectric material (e.g., silicon oxide) portion 182, in the via structures 86, 186 of the present embodiments. Furthermore, by using the disposable material portion 83, random height seams in the first conductive material layer 82L and resulting non-uniform upper surface in the a first conductive material portion 82 may be avoided. Therefore, the depth variations of the conductive fill material portion (e.g., tungsten) 85 can be reduced or avoided.

Furthermore, the lower part of the trench 79 and the conductive fill material portion (e.g., tungsten) 85 formed in the upper half of the trench 79 can be electrically connected via the metal nitride (e.g., TiN) barrier(s) 84, 184, 284. Resistance of wiring formed in the trench is thus decreased compared to where only polysilicon is formed in the lower part of the trench. Still further, the steps shown in FIGS. 19-21 can be performed in one chamber of a semiconductor processing apparatus. Therefore, the throughput is enhance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising:
   at least one material layer located over a substrate;
   a trench vertically extending from a topmost surface of the at least one material layer to a surface of the substrate; and
   a contact via structure located in the trench and comprising a lower conductive material portion and an upper conductive material portion, wherein:
   the lower conductive material portion comprises a first conductive material, contacts the surface of the substrate, has a first height that is less than a total thickness of the at least one material layer, and contains a cavity therein that extends downward from a topmost portion of the lower conductive material portion and has a depth less than the first height; and
   the upper conductive material portion comprises at least one second conductive material, fills the cavity within the lower conductive material portion, contacts the topmost portion of the lower conductive material portion, and extends to an upper portion of the trench.

2. The structure of claim 1, wherein the first conductive material comprises a doped semiconductor material, and the at least one second conductive material comprises at least one metallic material.

3. The structure of claim 1, wherein:
the upper conductive material portion extends upward from a top surface of the lower conductive material portion by a second height; and
a sum of the first height and the second height is the same as a total height of the trench.

4. The structure of claim 1, wherein the upper conductive material portion comprises:
a metallic liner contacting all surfaces of the cavity within the lower conductive material portion and extending to the top portion of the trench; and
a conductive fill material portion embedded within the metallic liner and vertically spaced from the lower conductive material portion by the metallic liner.

5. The structure of claim 4, wherein a bottom periphery of a sidewall of the metallic liner coincides with a top periphery of a sidewall of the lower conductive material portion.

6. The structure of claim 4, wherein the conductive fill material portion is vertically spaced from a bottommost surface of the trench by a vertical distance that is greater than a lateral thickness of the metallic liner above a top surface of the lower conductive material portion.

7. The structure of claim 4, wherein the conductive fill material portion includes a sub-portion that protrudes into the cavity below a top surface of the lower conductive material portion.

8. The structure of claim 4, wherein an entirety of the conductive fill material portion is located above a top surface of the lower conductive material portion.

9. The structure of claim 4, wherein:
the metallic liner comprises a conductive metallic nitride; and
the conductive fill material portion comprises a material selected from an elemental metal and an intermetallic alloy of at least two elemental metals.

10. The structure of claim 9, further comprising a doped semiconductor material portion embedded within the substrate and contacting a bottom surface of the lower conductive material portion, wherein the lower conductive material portion comprises a doped semiconductor material having a doping of a same conductivity type as the doped semiconductor material portion.

11. The structure of claim 1, further comprising an insulating spacer contacting a sidewall of the trench, an outer sidewall of the lower conductive material portion, and an outer sidewall of the upper conductive material portion.

12. The structure of claim 11, wherein the upper conductive material portion comprises:
a metallic liner contacting all surfaces of the cavity within the lower conductive material portion and extending to the top portion of the trench; and
a conductive fill material portion embedded within the metallic liner and vertically spaced from the lower conductive material portion by the metallic liner;
an entire inner sidewall of the lower conductive material portion contacts the metallic liner; and
an entire outer sidewall of the lower conductive material portion contacts a lower portion of the insulating spacer.

13. The structure of claim 12, wherein an entire outer sidewall of a sub-portion of the metallic liner located above a top surface of the lower conductive material portion contacts an upper portion of the insulating spacer.

14. The structure of claim 1, further comprising a vertical NAND device located over the substrate, wherein at least one material layer comprises electrically conductive layers that comprise, or are electrically connected to, a respective word line of the NAND device.

15. The structure of claim 14, wherein:
the substrate comprises a silicon substrate;
the NAND device comprises an array of monolithic three-dimensional NAND strings over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
each NAND string comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *